(12) United States Patent
Kim et al.

(10) Patent No.: US 10,808,142 B2
(45) Date of Patent: Oct. 20, 2020

(54) METHOD OF PREPARING GRAPHENE QUANTUM DOT, HARDMASK COMPOSITION INCLUDING THE GRAPHENE QUANTUM DOT OBTAINED BY THE METHOD, METHOD OF FORMING PATTERNS USING THE HARDMASK COMPOSITION, AND HARDMASK FORMED FROM THE HARDMASK COMPOSITION

(71) Applicant: Samsung Electronics Co., Ltd., Suwon-si, Gyeonggi-do (KR)

(72) Inventors: Sangwon Kim, Seoul (KR); Minsu Seol, Seoul (KR); Hyeonjin Shin, Suwon-si (KR); Dongwook Lee, Suwon-si (KR); Yunseong Lee, Osan-si (KR); Seongjun Jeong, Hwaseong-si (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/925,034

(22) Filed: Mar. 19, 2018

(65) Prior Publication Data

US 2019/0031906 A1    Jan. 31, 2019

(30) Foreign Application Priority Data

Jul. 28, 2017 (KR) .................. 10-2017-0096383

(51) Int. Cl.
*H01L 21/027* (2006.01)
*C09D 165/00* (2006.01)
(Continued)

(52) U.S. Cl.
CPC .......... *C09D 165/00* (2013.01); *C01B 32/182* (2017.08); *C01B 32/184* (2017.08);
(Continued)

(58) Field of Classification Search
CPC .......... H01L 21/31144; H01L 21/0274; H01L 21/31138; Y10S 977/739; Y10S 977/774;
(Continued)

(56) References Cited

U.S. PATENT DOCUMENTS

| 4,550,015 A | 10/1985 | Korb et al. |
| 4,679,054 A | 7/1987 | Yoshikawa et al. |

(Continued)

FOREIGN PATENT DOCUMENTS

| CN | 102774824 A | 11/2012 |
| CN | 102775786 A | 11/2012 |

(Continued)

OTHER PUBLICATIONS

U.S. Office Action dated May 10, 2016 issued in co-pending U.S. Appl. No. 14/791,912.

(Continued)

*Primary Examiner* — Caridad Everhart
(74) *Attorney, Agent, or Firm* — Harness, Dickey & Pierce, P.L.C.

(57) ABSTRACT

Provided are a method of preparing a graphene quantum dot, a graphene quantum dot prepared using the method, a hardmask composition including the graphene quantum dot, a method of forming a pattern using the hardmask composition, and a hardmask obtained from the hardmask composition. The method of preparing a graphene quantum dot includes reacting a graphene quantum dot composition and an including a polyaromatic hydrocarbon compound and an organic solvent at an atmospheric pressure and a temperature of about 250° C. The polyaromatic hydrocarbon compound may include at least four aromatic rings.

19 Claims, 12 Drawing Sheets

(51) Int. Cl.
| | |
|---|---|
| *G03F 7/16* | (2006.01) |
| *G03F 7/20* | (2006.01) |
| *G03F 7/38* | (2006.01) |
| *G03F 7/32* | (2006.01) |
| *H01L 21/311* | (2006.01) |
| *C01B 32/184* | (2017.01) |
| *G03F 7/09* | (2006.01) |
| *C01B 32/182* | (2017.01) |
| *C08G 61/02* | (2006.01) |
| *B82Y 40/00* | (2011.01) |
| *B82Y 30/00* | (2011.01) |

(52) U.S. Cl.
CPC .............. *C08G 61/02* (2013.01); *G03F 7/094* (2013.01); *G03F 7/162* (2013.01); *G03F 7/168* (2013.01); *G03F 7/2004* (2013.01); *G03F 7/322* (2013.01); *G03F 7/38* (2013.01); *H01L 21/0274* (2013.01); *H01L 21/31138* (2013.01); *H01L 21/31144* (2013.01); *B82Y 30/00* (2013.01); *B82Y 40/00* (2013.01); *C08G 2261/3424* (2013.01); *Y10S 977/734* (2013.01); *Y10S 977/774* (2013.01); *Y10S 977/842* (2013.01)

(58) Field of Classification Search
CPC ............. Y10S 977/842; Y10S 977/734; C01B 32/184; C09D 165/00
See application file for complete search history.

(56) References Cited

U.S. PATENT DOCUMENTS

| | | | |
|---|---|---|---|
| 5,328,560 | A | 7/1994 | Hanawa et al. |
| 5,432,227 | A | 7/1995 | Fujimura |
| 6,031,756 | A | 2/2000 | Gimzewski et al. |
| 6,120,858 | A | 9/2000 | Hirano et al. |
| 7,803,715 | B1 | 9/2010 | Haimson et al. |
| 8,008,095 | B2 | 8/2011 | Assefa et al. |
| 8,071,485 | B2 | 12/2011 | Lee et al. |
| 8,258,346 | B2 | 9/2012 | Rajendran |
| 8,524,594 | B2 | 9/2013 | Horikoshi |
| 8,871,639 | B2 | 10/2014 | Chien et al. |
| 8,999,529 | B2 | 4/2015 | Tetsuka et al. |
| 9,018,776 | B2 | 4/2015 | Song et al. |
| 9,105,780 | B2 | 8/2015 | Jeon et al. |
| 9,410,040 | B2 | 8/2016 | Li et al. |
| 9,562,169 | B2 | 2/2017 | Wang et al. |
| 9,583,358 | B2 | 2/2017 | Kim et al. |
| 9,666,602 | B2 | 5/2017 | Lee et al. |
| 9,721,794 | B2 | 8/2017 | Shin et al. |
| 9,770,709 | B2 | 9/2017 | Swager et al. |
| 2003/0203314 | A1 | 10/2003 | Sebald et al. |
| 2005/0112383 | A1 | 5/2005 | Tanaka et al. |
| 2005/0238889 | A1* | 10/2005 | Iwamoto .............. H05K 3/0011 428/446 |
| 2005/0250052 | A1 | 11/2005 | Nguyen |
| 2007/0026682 | A1 | 2/2007 | Hochberg et al. |
| 2007/0148557 | A1 | 6/2007 | Takei et al. |
| 2008/0032176 | A1 | 2/2008 | Shimizu et al. |
| 2008/0176741 | A1 | 7/2008 | Ma et al. |
| 2009/0011204 | A1 | 1/2009 | Wang et al. |
| 2009/0140350 | A1 | 6/2009 | Zhu |
| 2009/0297784 | A1 | 12/2009 | Xu et al. |
| 2010/0055464 | A1 | 3/2010 | Sung |
| 2010/0086463 | A1 | 4/2010 | Rudhard et al. |
| 2010/0170418 | A1 | 7/2010 | Afzali-Ardakani et al. |
| 2010/0218801 | A1 | 9/2010 | Sung et al. |
| 2010/0316950 | A1 | 12/2010 | Oguro et al. |
| 2011/0014111 | A1 | 1/2011 | Leugers et al. |
| 2011/0210282 | A1 | 9/2011 | Foley |
| 2011/0241072 | A1* | 10/2011 | Wang .................. C30B 25/04 257/190 |
| 2012/0153511 | A1 | 6/2012 | Song et al. |
| 2012/0181507 | A1 | 7/2012 | Dimitrakopoulos et al. |
| 2012/0193610 | A1 | 8/2012 | Kim |
| 2012/0279570 | A1* | 11/2012 | Li .............................. C09C 1/44 136/263 |
| 2012/0326391 | A1 | 12/2012 | Hirose et al. |
| 2012/0329273 | A1 | 12/2012 | Bruce et al. |
| 2013/0011630 | A1 | 1/2013 | Sullivan et al. |
| 2013/0119350 | A1 | 5/2013 | Dimitrakopoulos et al. |
| 2013/0133925 | A1 | 5/2013 | Kim et al. |
| 2013/0200424 | A1* | 8/2013 | An ...................... H01L 21/0237 257/99 |
| 2013/0203198 | A1* | 8/2013 | Min ...................... H01L 51/428 438/46 |
| 2013/0236715 | A1 | 9/2013 | Zhamu et al. |
| 2013/0313523 | A1 | 11/2013 | Yun et al. |
| 2014/0015000 | A1 | 1/2014 | Nishiyama et al. |
| 2014/0098458 | A1 | 4/2014 | Almadhoun et al. |
| 2014/0102624 | A1 | 4/2014 | Melamed et al. |
| 2014/0183701 | A1 | 7/2014 | Choi et al. |
| 2014/0186777 | A1 | 7/2014 | Lee et al. |
| 2014/0187035 | A1 | 7/2014 | Posseme et al. |
| 2014/0239462 | A1 | 8/2014 | Shamma et al. |
| 2014/0299841 | A1 | 10/2014 | Nourbakhsh et al. |
| 2014/0320959 | A1 | 10/2014 | Jun et al. |
| 2014/0342273 | A1 | 11/2014 | Kim et al. |
| 2015/0001178 | A1 | 1/2015 | Song et al. |
| 2015/0004531 | A1 | 1/2015 | Choi et al. |
| 2015/0008212 | A1 | 1/2015 | Choi et al. |
| 2015/0023858 | A1* | 1/2015 | Tour ...................... C01B 21/064 423/276 |
| 2015/0030968 | A1 | 1/2015 | Schwab et al. |
| 2015/0064904 | A1 | 3/2015 | Yao et al. |
| 2015/0129809 | A1 | 5/2015 | Gauthy et al. |
| 2015/0137077 | A1 | 5/2015 | Yun et al. |
| 2015/0200090 | A1 | 7/2015 | Chada et al. |
| 2015/0200091 | A1 | 7/2015 | Chada et al. |
| 2015/0348791 | A1 | 12/2015 | Higuchi et al. |
| 2015/0348794 | A1 | 12/2015 | Kim et al. |
| 2015/0376014 | A1 | 12/2015 | Cesareo et al. |
| 2015/0377824 | A1 | 12/2015 | Ruhl et al. |
| 2016/0005625 | A1 | 1/2016 | Shin et al. |
| 2016/0011511 | A1 | 1/2016 | Shin et al. |
| 2016/0027645 | A1 | 1/2016 | Shin et al. |
| 2016/0043384 | A1 | 2/2016 | Zhamu et al. |
| 2016/0060121 | A1* | 3/2016 | Lee ...................... C01B 32/184 428/402 |
| 2016/0060122 | A1* | 3/2016 | Tour ...................... C01B 32/194 423/415.1 |
| 2016/0130151 | A1 | 5/2016 | Kurungot et al. |
| 2016/0152477 | A1 | 6/2016 | Xiao et al. |
| 2016/0152748 | A1 | 6/2016 | Goffredi et al. |
| 2016/0179005 | A1 | 6/2016 | Shamma et al. |
| 2016/0211142 | A1 | 7/2016 | Kim et al. |
| 2016/0225991 | A1 | 8/2016 | Schwab et al. |
| 2016/0240841 | A1 | 8/2016 | He et al. |
| 2016/0282721 | A1 | 9/2016 | Seol et al. |
| 2016/0284811 | A1 | 9/2016 | Yu et al. |
| 2016/0291472 | A1 | 10/2016 | Shin et al. |
| 2016/0308134 | A1* | 10/2016 | Li ...................... H01L 51/0045 |
| 2016/0346760 | A1 | 12/2016 | Kim et al. |
| 2016/0369149 | A1 | 12/2016 | Liu et al. |
| 2017/0368535 | A1* | 12/2017 | Chopra .................. B01J 21/18 |
| 2018/0022994 | A1* | 1/2018 | Isaji .................... C09K 11/08 252/301.4 R |
| 2018/0047906 | A1* | 2/2018 | Begue .................. C08G 61/126 |
| 2018/0251678 | A1* | 9/2018 | Saikia .................... C01B 32/20 |
| 2019/0031906 | A1 | 1/2019 | Kim et al. |
| 2019/0101524 | A1* | 4/2019 | Han ...................... B82B 1/001 |
| 2019/0294047 | A1 | 9/2019 | Shin et al. |

FOREIGN PATENT DOCUMENTS

| | | |
|---|---|---|
| EP | 1703328 A1 | 9/2006 |
| EP | 2 735 904 A1 | 5/2014 |
| EP | 2950334 A1 | 12/2015 |
| EP | 3 076 239 A1 | 10/2016 |
| JP | H 5-343308 A | 12/1993 |
| JP | 3396846 B2 | 4/2003 |

(56) References Cited

FOREIGN PATENT DOCUMENTS

| JP | 2005-173552 A | 6/2005 |
|---|---|---|
| JP | 4488234 B2 | 6/2010 |
| JP | 4531400 B2 | 8/2010 |
| JP | 2013-6732 A | 1/2013 |
| JP | 2013-185155 A | 9/2013 |
| JP | 2013208881 A | 10/2013 |
| JP | 2017-036411 A | 2/2017 |
| JP | 2017064714 A | 4/2017 |
| KR | 101057218 B1 | 8/2011 |
| KR | 10-2012 0024756 A | 3/2012 |
| KR | 101257694 B1 | 4/2013 |
| KR | 101262515 B1 | 5/2013 |
| KR | 10-2013-0132103 A | 12/2013 |
| KR | 101343014 B1 | 12/2013 |
| KR | 10-2014-0066524 A | 6/2014 |
| KR | 101423171 B1 | 7/2014 |
| KR | 10-1439030 B1 | 9/2014 |
| KR | 10-2015-0047326 A | 5/2015 |
| KR | 10-2016-0012804 A | 2/2016 |
| KR | 20160100172 A | 8/2016 |
| KR | 10-2016-0118782 A | 10/2016 |
| WO | WO-2013/100365 A1 | 7/2013 |
| WO | WO-2014/135455 A1 | 9/2014 |

OTHER PUBLICATIONS

U.S. Office Action dated Mar. 28, 2016 issued in co-pending U.S. Appl. No. 14/697,150.
Silane Coupling Agents, Xiameter for Dow Corning, Silicones Simplified, pp. 1-7, (2009).
Grenadier, et al. "Dry etching techniques for active devices based on hexagonal boron nitride epilayers," Journal of Vacuum Science & Technology A, vol. 31, pp. 061517-061517.3 (2013).
S. Hascik, et al. "Dry etching of carbon layers in various etch gases," Vacuum, vol. 58, pp. 434-439 (2000).
Albert S. Nazarov, et al. "Functionalization and dispersion of h-BN nanosheets treated with inorganic reagents," Chemistry, An Asian Journal, vol. 7, Issue 3, pp. 1-6, (2012).
U.S. Office Action dated Aug. 16, 2016 issued in co-pending U.S. Appl. No. 14/791,912.
U.S. Office Action dated Sep. 30, 2016 issued in co-pending U.S. Appl. No. 14/697,150.
European Search Report dated Sep. 30, 2015 issued in European Application No. 15169702.6.
Zhang, et al. "Fabrication of highly oriented reduced graphene oxide microbelts array for massive production of sensitive ammonia gas sensors", Journal of MicroMechanics and MicroEngineering, vol. 23, pp. 1-8, (2013).
Huang, et al. "An innovative way of etching MoS2: Characterization and mechanistic investigation", Nano Research, vol. 6, No. 3, pp. 200-207, (2013).
Hwang, et al. "Transparent actuator made with tew layer graphene electrode and dielectric elastomer, for variable focus lens", Applied Physics Letters, vol. 103, pp. 023106-1-023106-5, (2013).
Morozan, A. et al., "Catalytic activity of cobalt and iron phthalocyanines or porphyrins supported on different carbon nanotubes towards oxygen reduction reaction," Carbon, vol. 49, No. 14, Jul. 2, 2011, pp. 4839-4847.
Ghani, F. et al., "Solubility Properties of Unsubstituted Metal Phthalocyanines in Different Types of Solvents," Journal of chemical and Engineering Data, vol. 57, No. 2, Jan. 27, 2017, pp. 439-449.
Li, Z. et al., "Superstructured Assembly of Nanocarbons: Fullerenes, Nanotubes, and Graphene," Chemical Reviews, vol. 115, No. 15, Jul. 13, 2015, pp. 7046-7117.
Extended European Search Report for EP Appl. No. 18183070.4 dated Nov. 23, 2018.
U.S. Notice of Allowance dated Jul. 16, 2018 issued in U.S. Appl. No. 14/825,792.
U.S. Notice of Allowance dated Jul. 20, 2018 issued in U.S. Appl. No. 15/611,935.
U.S. Office Action dated May 22, 2018 issued in U.S. Appl. No. 14/843,003.
U.S. Office Action dated Feb. 22, 2018 issued in U.S. Appl. No. 14/825,792.
U.S. Notice of Allowance dated Mar. 27, 2018 issued in U.S. Appl. No. 15/611,935.
U.S. Office Action dated Dec. 5, 2017 issued in U.S. Appl. No. 15/611,935.
U.S. Notice of Allowance dated Feb. 1, 2018 issued in U.S. Appl. No. 14/791,912.
U.S. Office Action dated Jun. 13, 2017 issued in U.S. Appl. No. 14/791,912.
U.S. Office Action dated Feb. 8, 2017 issued in U.S. Appl. No. 14/791,912.
U.S. Office Action dated Oct. 6, 2017 issued in U.S. Appl. No. 14/843,003.
U.S. Notice of Allowance dated Aug. 28, 2017 issued in U.S. Appl. No. 14/791,912.
U.S. Notice of Allowance dated Oct. 19, 2016 issued in U.S. Appl. No. 14/725,390.
U.S. Office Action dated Mar. 22, 2016 issued in U.S. Appl. No. 14/725,390.
U.S. Notice of Allowance dated Mar. 15, 2017 issued in U.S. Appl. No. 14/697,150.
Shin, et al. "Mass Production of Graphene Quantum Dots by One-Pot Synthesis Directly from Graphite in High Yield," small communications, vol. 10, No. 5, pp. 866-870 (2014).
Wang, et al. "Gram-scale synthesis of single-crystalline graphene quantum dots with superior optical properties," Nature Communications, pp. 1-9 (2014).
Song, et al. "Highly Efficient Light-Emitting Diode of Graphene Quantum Dots Fabricated from Graphite Intercalation Compounds," Adv. Optical Mater, pp. 1-8 (2014).
Extended European Search Report dated Aug. 17, 2016 issued in European Application No. 15193939.4.
Notice of Allowance and Fee(s) Due for co-pending U.S. Appl. No. 15/332,287 dated Aug. 9, 2018.
Office Action for co-pending U.S. Appl. No. 14/791,912 dated Aug. 10, 2018.
Office Action dated Jun. 25, 2019, issued in co-pending U.S. Appl. No. 16/036,113.
Notice of Allowance dated Jan. 16, 2020, issued in co-pending U.S. Appl. No. 16/036,113.
S. Sarkar et al., 'Diels-Alder Chemistry of Graphite and Graphene: Graphene as Diene and Dienophile' *Journal of the American Chemistry Society*, vol. 133, Feb. 2011, pp. 3324-3327.

\* cited by examiner

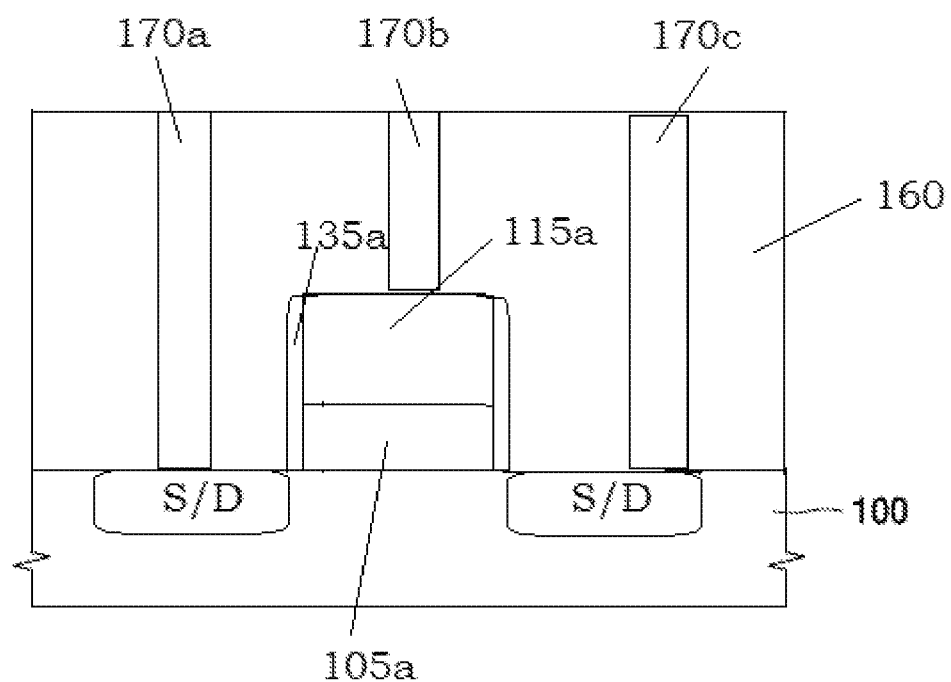

METHOD OF PREPARING GRAPHENE QUANTUM DOT, HARDMASK COMPOSITION INCLUDING THE GRAPHENE QUANTUM DOT OBTAINED BY THE METHOD, METHOD OF FORMING PATTERNS USING THE HARDMASK COMPOSITION, AND HARDMASK FORMED FROM THE HARDMASK COMPOSITION

CROSS-REFERENCE TO RELATED APPLICATION

This application claims the benefit of Korean Patent Application No. 10-2017-0096383, filed on Jul. 28, 2017, in the Korean Intellectual Property Office, the disclosure of which is incorporated herein in its entirety by reference.

BACKGROUND

1. Field

The present disclosure relates to a method of preparing graphene quantum dots, a hardmask composition including the graphene quantum dots obtained using the method, a method of forming a pattern using the hardmask composition, and a hardmask formed using the hardmask composition.

2. Description of Related Art

The semiconductor industry has developed an ultrafine technique for providing a pattern of several to several tens of nanometers in size. Such an ultrafine technique benefits from effective lithographic techniques. A typical lithographic technique includes forming a material layer on a semiconductor substrate, coating a photoresist layer on the material layer, exposing and developing the same to obtain a photoresist pattern, and etching the material layer by using the photoresist pattern as a mask.

As a size of a pattern to be formed becomes smaller, it has become difficult to form a fine pattern having a desirable profile by using a typical lithographic technique alone. In this regard, a layer called a "hardmask" may be formed between a material layer to be etched and a photoresist layer and used to form a fine pattern. The hardmask serves as an interlayer that transfers the fine photoresist pattern to the material layer through a selective etching process. Thus, the hardmask layer needs to have chemical resistance, thermal resistance, and etching resistance in order to be durable against various etching processes.

As semiconductor devices have become highly integrated, an aspect ratio of a material layer has become increased as a line width of the material layer has narrowed while its height has been maintained the same or has relatively increased. Under these circumstances, the heights of a photoresist layer and a hardmask pattern need to be increased for etching. However, there is a limitation in increasing the heights of the photoresist layer and the hardmask pattern. In addition, the hardmask pattern may be damaged during an etching process performed to obtain a material layer having a narrow line width, thus deteriorating electrical characteristics of devices.

In this regard, methods of using a hardmask in the form of a single layer or a stack of multiple layers formed of a conductive or insulating material, such as a polysilicon layer, a tungsten layer, and a nitride layer, have been suggested. However, since the single layer or the multiple layers are formed at a high deposition temperature, modification of physical properties of the material layer may occur. Therefore, new hardmask materials are being developed.

SUMMARY

Provided is an easy method of preparing graphene quantum dots.

Provided is a hardmask composition including the graphene quantum dots prepared using the method.

Provided is a method of forming a pattern using the hardmask composition.

Provided is a hardmask formed using the hardmask composition.

Additional aspects will be set forth in part in the description which follows and, in part, will be apparent from the description, or may be learned by practice of the presented embodiments.

According to some example embodiments, a method of preparing a graphene quantum dot includes reacting a graphene quantum dot composition including a polyaromatic hydrocarbon compound and an organic solvent at an atmospheric pressure and a temperature of about 250° C. or less. The polyaromatic hydrocarbon compound may include at least four aromatic rings.

According to some example embodiments, a hardmask composition may include a solvent and the graphene quantum dot prepared using the above-described method. The graphene quantum dot may a size of about 50 nm or less According to some example embodiments, a method of forming a pattern may include forming a target etching layer on a substrate, forming a hardmask on the target etching layer, forming a photoresist layer on the hardmask, forming a hardmask pattern using the photoresist layer as an etch mask, and etching the target etching layer using the hardmask pattern as an etch mask. The hardmask may include a product of coating the above-described hardmask composition onto the target etching layer and thermally treating the hardmask composition. The hardmask pattern may include the product of coating and thermally treating the hardmask composition.

According to some example embodiments, a hardmask may include a product of coating and thermally treating the above-described hardmask composition.

BRIEF DESCRIPTION OF THE DRAWINGS

These and/or other aspects will become apparent and more readily appreciated from the following description of some example embodiments, taken in conjunction with the accompanying drawings in which:

FIGS. 8A to 8E are cross-sectional views for explaining a method of forming an electronic device using a hardmask composition according to some example embodiments.

DETAILED DESCRIPTION

Figure 1:
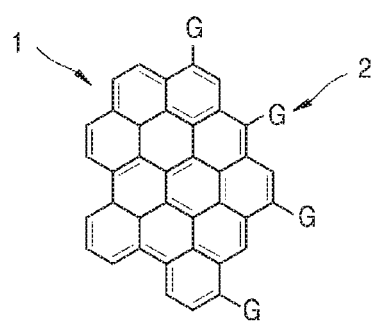
FIG. 1 is a schematic illustration of graphene quantum dots according to some example embodiments of inventive concepts.

Reference will now be made in detail to some example embodiments, which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments of a hardmask composition, a method of forming a pattern using the hardmask composition, and a hardmask formed from the hardmask composition will be described in detail.

According to some example embodiments of inventive concepts, a method of preparing a graphene quantum dot includes reacting a graphene quantum dot composition comprising a polyaromatic hydrocarbon compound including at least four rings, and an organic solvent at a temperature of about 250° C. or less under an atmospheric pressure.

In general, graphene quantum dots may be prepared in an autoclave using water as a solvent under high-temperature and high-pressure conditions. However, it is difficult to control the size of graphene quantum dots with this preparation method. The conventional preparation method also requires such a high-temperature, high-pressure reactor, and a process of cooling the reactor, so that the reaction time may become longer, and the preparation cost of graphene quantum dots is high. Therefore, improvements are required in these regards.

Inventive concepts provides an easy method of preparing graphene quantum dots by thermal treatment under an atmospheric pressure and a temperature of about 250° C., not by hydrothermal reaction under high-temperature, high-pressure conditions. In the preparation method according to one or more embodiments, it may be easy to control the reaction time and the degree of reaction and to control the size of graphene quantum dots. High-purity graphene quantum dots having a narrower distribution of molecular weights, relative to when using the conventional preparation method, may be obtained with a high yield. Using the preparation method of graphene quantum dots according to one or more embodiments, monodisperse graphene quantum dots may be easily obtained, unlike the conventional method of preparing graphene quantum dots through hydrothermal reaction under high-temperature and high-pressure conditions, the graphene quantum dots prepared by the conventional method having a wide distribution of molecular weights.

In the conventional method of preparing graphene quantum dots using a pressure reactor, unlike the preparation of graphene quantum dots according to one or more embodiments, since the reaction stops after the pressure is relieved, it may be difficult to precisely control the reaction time.

As used herein, the term "atmospheric pressure" refers to an atmospheric pressure of about 1 atm.

The polyaromatic hydrocarbon compound including at least four rings, for example, four aromatic rings as a compound having at least four aromatic rings, may have a structure in which the aromatic rings are bound or fused to one another via a linker. The polyaromatic hydrocarbon compound including at least four rings may be at least one selected from among 1,3,6-trinitropyrene, 1,2-dinitropyrene, 1,6-dinitropyrene, 1,3,6-trichloropyrene, and 1,3,6,8-tetrachloropyrene.

A polyaromatic hydrocarbon compound including less than 4 rings, for example, including 1 to 3 rings, may not undergo aromatization under atmospheric pressure at about 250° C. or less, so that it may be difficult to obtain high-crystallinity quantum dots, and the yield may be low.

In some embodiments, the graphene quantum dot may be prepared by thermal treatment under an atmospheric pressure at a temperature of about 250° C. or lower, in some embodiments, about 200° C. or lower, in some other embodiments, about 30° C. to about 200° C., and in still other embodiments, about 100° C. to about 200° C.

In some other embodiments, the graphene quantum dot may be performed under refluxing the solvent in the graphene quantum dot composition.

In some embodiments, the graphene quantum dot composition may further include a catalyst. When the graphene quantum dot composition further includes a catalyst, the thermal treatment temperature and time may be reduced, relative to when the graphene quantum dot composition not including a catalyst is used.

The catalyst may be a precious metal catalyst, a precious metal-transition metal alloy catalyst, a semiconductor catalyst, an organic catalyst, or a combination thereof. The precious metal catalyst may include at least one precious metal selected from among Pt, Pd, Ir, Rh, Ru, and Re. The precious metal-transition metal alloy catalyst may include an alloy of at least one precious metal selected from among Pt, Pd, Ir, Rh, Ru, and Re, and at least one transition metal selected from among Ti, V, Mn, Cr, Fe, Ni, Co, Cu, and Zn. The semiconductor catalyst may include an oxide of at least one selected from Si, Ge, and Sn. The organic catalyst may include at least one amine compound selected from among 4-(dimethylamino)pyridine (DMAP), diisopropylethylamine (DIEA), pyridine, triethylamine, 2,6-lutidine, collidine, 4-(dimethylamino)pyridine (DMAP), 1,5-diazabicyclo[4.3.0]non-5-ene (DBN), and 1,8-diazabicyclo[5.4.0]undec-7-ene (DBU).

An amount of the catalyst may be, for example, about 0.1 mole % to about 3 mole % based on the amount of the graphene quantum dot. When the amount of the catalyst is within this range, graphene quantum dots may be prepared within a reduced time with an increased yield.

For example, an amount of the polyaromatic hydrocarbon compound including at least four rings in the graphene quantum dot composition may be about 0.01 wt % to about 40 wt %, and in some embodiments, about 0.1 wt % to about 30 wt %, and some other embodiments, about 0.1 wt % to about 20 wt %, and in some other embodiments, about 3 wt % to about 15 wt %, and in still other embodiments, about 5 wt % to about 10 wt %.

When the amount of the polyaromatic hydrocarbon compound including at least four rings in the graphene quantum dot composition is in a range of about 5 wt % to about 20 wt %, a side reaction between precursors may be inhibited and high-crystallinity graphene quantum dots may be obtained. When the amount of the polyaromatic hydrocarbon compound including at least four aromatic rings in the graphene quantum dot composition is within this range, high-purity graphene quantum dots having a narrow distribution of molecular weights may be easily prepared.

The solvent may be, for example, N-methyl-2-pyrrolidone, dimethylformamide, dimethylsulfoxide, dimethylacetamide, hexamethylphosphoramide, tetramethylene sulfone, N-methylformamide, $NH_4OH$, cyclohexanone, or ethyl lactate.

For example, the graphene quantum dots obtained according to the above-described processes may have a size of about 50 nm or less, and in some embodiments, about 30 nm or less, and in some other embodiments, about 20 nm or less, and in still other embodiments, about 0.1 nm to about 10 nm.

As used herein, the size of graphene quantum dots may refer to an average particle diameter when the graphene quantum dots are spherical, or may refer to a length of the major axis when the graphene quantum dots are non-spherical.

In nuclear magnetic resonance (NMR) spectra of the graphene quantum dots prepared using the above-described method according to one or more embodiments, it was found that no peak appeared at a chemical shift of about 9 ppm to about 10 ppm, indicating that the graphene quantum dots may have improved purity.

The graphene quantum dots prepared using the above-described method according to one or more embodiments may have a weight average molecular weight of, for example, about 1,500 to about 3,000 with a reduced polydispersity index, relative to graphene quantum dots prepared according to general hydrothermal synthesis methods. The polydispersity index may be calculated by dividing the weight average molecular weight (Mw) by the number average molecular weight (Mn), which may be obtained using gel transmission chromatography (GPC).

In some embodiments, a mixed atom ratio of carbon to nitrogen in the graphene quantum dots prepared using the method according to the one or more embodiments may be about 8:1 to about 10:1.

In some embodiments, when the graphene quantum dots are functionalized with a hydroxy group and an amino group, a mixed ratio of the hydroxyl group to the amino group may be about 50:50 to about 70:30, for example, about 65:35.

In some embodiments, the graphene quantum dots may have at an end thereof at least one functional group selected from the group consisting of a hydroxyl group, a carbonyl group, a carboxyl group, an epoxy group, an amine group, and an imide group. When such a functional group is bound to the edge of the graphene quantum dots, a hardmask formed from the hardmask composition may have improved etching resistance, relative to when such first functional groups are present at the center of the graphene quantum dots.

According to another aspect of inventive concepts, a hardmask composition includes the graphene quantum dots prepared by the method according to one or more embodiments.

The amount of the graphene quantum dots may be in a range of about 0.01 wt % to about 40 wt % based on a total weight of the hardmask composition. When the amount of the graphene quantum dots is within this range, a hardmask formed from the hardmask composition may have improved stability and improved etching resistance.

According to some example embodiments of inventive concepts, a hardmask includes a product of coating and thermally treating the hardmask composition according to the above-described one or more embodiments.

In X-ray photoelectron spectra (XPS) of the product of coating and thermally treating the hardmask composition, a binding energy at a maximum intensity of a peak corresponding to C1s of the product may be about 284 eV to about 290 eV, which may be greater than a peak intensity corresponding to C1s of graphene quantum dots obtained by hydrothermal reaction, and a binding energy of a peak corresponding to $sp^3$ C—N of the product may be about 287 eV to about 289 eV.

In X-ray photoelectron spectra (XPS) of the product of coating and thermally treating the hardmask composition, a binding energy at a maximum intensity of a peak corresponding to O1s of the product is about 530 eV to about 535 eV, which may be about 1.1 times or greater, for example, about 1.1 times to about 1.5 times or greater, than a peak intensity corresponding to O1s of graphene quantum dots obtained by hydrothermal reaction.

In X-ray photoelectron spectra (XPS) of the product of coating and thermally treating the hardmask composition, a binding energy at a maximum intensity of a peak corresponding to N1s of the product may be about 398 eV to about 402 eV, which may be about 2 times or greater than a peak intensity corresponding to N1s of graphene quantum dots obtained by hydrothermal reaction.

As used herein, the term "graphene quantum dots" may be defined as follows.

Graphene quantum dots (or "GQD") may refer to graphene in the form of dots or sheets having a size of about 1 nm to about 50 nm, for example, about 1 nm to about 30 nm, or about 1 nm to about 10 nm, made semi-conductive from conductive graphene. For example, the graphene quantum dots may refer to oxidized graphene quantum dots and/or reduced product of oxidized graphene quantum dots having a size of about 1 nm to about 10 nm. When the graphene quantum dots have a size within this range, an etch rate of the hardmask may be appropriately controlled, and the graphene quantum dots may have improved dispersion characteristics in the mask composition.

The term "size" of the graphene quantum dots may refer to an average particle diameter when the graphene quantum dots are spherical (or dot form), may refer to a diameter on a 2-dimensional plane when the graphene quantum dots have a planar structure, may refer to a length of the major axis when the graphene quantum dots are in elliptical or sheet form. The graphene quantum dots may have a 2-dimensional planar structure or a spherical structure. Herein, the term "spherical" may mean all types of shape substantially close to a sphere, for example, a spherical or elliptical shape.

The graphene quantum dots may have, for example, a size of about 2 nm to about 10 nm, for example, about 5 nm to about 8 nm, or about 6 nm to about 8 nm, and may include, for example, 300 layers or less, for example, 100 layers or less, or about 1 layer to about 20 layers. The graphene quantum dots may have a thickness of about 100 nm or less.

The graphene quantum dots may have a 2-dimensional sheet form with a size to thickness ratio of about 3 to about 30, for example, about 5 to about 25.

When the graphene quantum dots are in the form of a sheet, the size (a length of the major axis) may be about 10 nm or less, and a length of the minor axis may be about 0.5 nm to about 5 nm. When a size, the number of layers, and a thickness of the graphene quantum dots are within these ranges, the hardmask composition may have improved stability.

For example, the graphene quantum dots may include about 100 to about 60,000 conjugated atoms, and in some embodiments, about 100 to about 600 conjugated atoms.

In the term "graphene quantum dots" or "GQDs" used herein, "graphene" may refer to a sheet structure of a single atomic layer formed by a carbon nanostructure that forms polycyclic aromatic molecules in which a plurality of carbon atoms are covalently bound and aligned in a planar shape; a network structure in which a plurality of carbon nanostructures as a small film having a plate shape are interconnected and aligned in a planar shape; or a combination thereof. The covalently bound carbon atoms may form 6-membered rings as repeating units, but may further include 5-membered rings and/or 7-membered rings. The graphene quantum dots may be formed by stacking a plurality of layers including several sheet structures and/or network structures. For example, the graphene quantum dots may have an average thickness of about 100 nm or less, and in some embodiments, about 10 nm or less, and in some other embodiments about 0.01 nm to about 10 nm.

The COOH-functionalized GQDs may be obtained by adding chloroacetic acid to bare GQDs or OH-functionalized GQDs. The OH-functionalized GQDs may be obtained by a general method of introducing a hydroxyl group to GQDs. For example, the OH-functionalized GQDs may be obtained by grinding GQDs into a certain size, adding a base and an oxidizing agent to the ground GQDs, and then further grinding a resulting product. An example of the base may be sodium hydroxide. An example of the oxidizing agent may be hydrogen peroxide.

The GQDs may contain an edge carbon (edge C) existing at an edge site and a center carbon (center C) existing at a center site. The edge carbon may have a $sp^3$ binding structure, and the center carbon may have a $sp^2$ binding structure. Since a functional group (e.g., oxygen or nitrogen) may be bound to the edge carbon, the edge carbon may have a higher reactivity to an etching solution relative to the center carbon.

In the GQDs according to one or more embodiments, an amount of the edge carbon may be about 20 atom % or less, for example, in a range of about 1.2 atom % to about 19.1 atom %.

The amounts of the edge carbon and the center carbon in the GQDs may be calculated based on the length of carbon-carbon bonds.

The GQDs may include about 0.01 atom % to about 40 atom % of oxygen, for example, about 10 atom % to about 30 atom % of oxygen. The amount of oxygen may be identified by X-ray photoelectron spectroscopy (XPS). When the amount of oxygen is within these ranges, degassing may not occur during an etching process of the hardmask formed by using the hardmask composition, and the hardmask may have improved etching resistance. When the amount of oxygen in the GQDs is within any of the above-described ranges, the GQDs may have hydrophilic property, and thus an improved adhesive strength to another layer. The GQDs may also have improved dispersibility in a solvent, and preparing the hardmask composition according to embodiments may become easier. In addition, etching resistance to an etching gas may be improved due to a high bond dissociation energy of the functional group including oxygen atom.

The terms "D50", "D90", and "D10" of the graphene quantum dots may refer to particle sizes at volume ratios of 50%, 90%, and 10%, respectively, in a cumulative distribution curve of the graphene quantum dots having different sizes accumulated from smallest to largest. The term "particle size" may refer to an average particle diameter when the graphene quantum dots have a spherical shape, or a length of the major axis when the graphene quantum dots have a non-spherical shape (for example, an elliptical or a rectangular shape).

In the hardmask formed of the hardmask composition according to one or embodiments, light scattering may not occur in a range of visible light, and a transmittance of the hardmask at a wavelength of about 633 nm may be about 1% or lower. In this regard, when a hardmask having improved transmittance is used, identifying a hardmask pattern and an alignment mark for patterning a target etching layer becomes easier, and thus the target etching layer may be patterned to a finer and more compact pattern size.

The GQDs contained in the hardmask may have a k of about 0.5 or lower, for example, about 0.3 or lower, or 0.1 or lower, at a wavelength of about 633 nm. For comparison, k of graphite is in a range of about 1.3 to about 1.5, and k of graphene, which is formed of only a $sp^2$ bond structure, is in a range of about 1.1 to about 1.3.

k is an extinction coefficient which is measured by using a spectroscopic ellipsometer. When k of the GQDs is within the range above and a hardmask formed using the GQDs is used, an alignment mark may be easily detected.

A total thickness of the GQDs may be, for example, in a range of about 0.34 nm to about 100 nm. The GQDs having a thickness within this range may have a stable structure. The GQDs according to embodiments may contain some oxygen atoms in addition to carbon atoms rather than having a complete C=C/C—C conjugated structure. A carboxyl group, a hydroxyl group, an epoxy group, or a carbonyl group may be also present at an end of the graphene quantum dots.

The GQDs may have improved solvent dispersibility, and thus may facilitate preparation of a hardmask composition having improved stability. The hardmask formed by the hardmask composition may have improved etching resistance against an etching gas.

In the hardmask composition according to embodiments, the GQDs may exhibit peaks at about 1340-1350 $cm^{-1}$, about 1580 $cm^{-1}$, and about 2700 $cm^{-1}$ in the Raman spectra. These peaks provide information of a thickness, a crystallinity, and a charge doping status of the GQDs. The peak observed at about 1,580 $cm^{-1}$ is a "G-mode" peak, which is generated in a vibration mode corresponding to stretching of a carbon-carbon bond. Energy of the "G-mode" is determined according to the density of an excess of charges doped in the GQDs. The peak observed at about 2,700 $cm^{-1}$ is a "2D-mode" peak that is useful in evaluating the thickness of the GQDs. The peak observed at about 1,340 $cm^{-1}$ to about 1,350 $cm^{-1}$ is a "D-mode" peak, which appears when a $sp^2$ crystal structure has defects and which is mainly observed when many defects are in a sample or around edges of the sample. An intensity ratio of a D peak to a G peak (a D/G intensity ratio) provides information of a degree of disorder of crystals in the GQDs.

The GQDs may have, as analyzed by Raman spectroscopy, an intensity ratio ($I_D/I_G$) of a D mode peak to a G mode peak of about 2 or less, for example, about 0.001 to about 2.0.

The GQDs may have, as analyzed by Raman spectroscopy, an intensity ratio ($I_{2D}/I_G$) of a 2D mode peak to a G mode peak of about 0.01 or greater, and in some embodiments, about 0.01 to about 1, and in some other embodiments, about 0.05 to about 0.5.

When the intensity ratio ($I_D/I_G$) of a D mode peak to a G mode peak and the intensity ratio ($I_{2D}/I_G$) of a 2D mode peak to a G mode peak are within any of these ranges, the GQDs may have a relatively high crystallinity and relatively few defects, and thus may have an increased binding energy. Accordingly, a hard mask formed using the GQDs may have etching resistance.

According to results of X-ray diffraction analysis with CuKα radiation, the GQDs may have a 2-dimensional (2D) layered structure having a peak corresponding to the (002) crystal plane at about 20° to about 27°.

The GQDs may have an interlayer distance (d-spacing) of about 0.3 nm to about nm, for example, about 0.334 nm to about 0.478 nm, as analyzed by X-ray diffraction analysis. When using the GQDs having a (002) crystal plane peak and a d-spacing within the above ranges, a hard mask composition having improved etching resistance may be obtained.

In the hard mask composition according to embodiments, the GQDs may have a higher content of $sp^2$ carbon relative to $sp^3$ carbon and a relatively high content of oxygen, relative to a conventional amorphous carbon layer. A $sp^2$ carbon bond, i.e., a bond of an aromatic structure, may have a higher binding energy than a $sp^3$ carbon bond.

The $sp^3$ structure is a 3-dimensional (3D) binding structure as a regular tetrahedron of carbons likes diamond. The $sp^2$ structure is a 2D binding structure of graphite having an increased ratio of carbon to hydrogen (a C/H ratio), thus ensuring resistance to dry etching.

In the GQDs according to embodiments, a ratio of sp2 carbon fraction to sp3 carbon fraction may be 1 or greater, for example, about 1.0 to about 10, and in some embodiments, 1.88 to 3.42.

An amount of the $sp^2$ carbon atom bonding structure may be about 30 atom % or more, for example, about 39.7 atom % to about 62.5 atom %, as analyzed by stimulated carbon (C1s) XPS. When the mixing ratio of $sp^2$ carbon to $sp^2$ carbon is within these ranges, bond breakage of the GQDs may become difficult due to high carbon-carbon bond energy. Thus, when a hardmask composition including the GQDs is used, etching resistance characteristics may be improved during the etching process. The binding strength between the hardmask and adjacent layers may also be increased.

A hardmask obtained by using conventional amorphous carbon mainly includes a $sp^2$ carbon atom binding structure, and thus has etching resistance but low transparency, causing a hardmask alignment problem and generating a large amount of particles during a deposition process. For these reasons, a hardmask using a diamond-like carbon having a $sp^3$ carbon atom binding structure was developed. However, this hardmask also had a limitation for application to processes due to low etching resistance.

Graphite has a k value of about 1.3 to about 1.5, and graphene having a sp2 structure has a k value of about 1.1 to about 1.3. However, the GQDs according to embodiments may have a k value of about 1.0 or less, for example, about 0.1 to about 0.5 at a desired (and/or alternatively predetermined) wavelength, and thus may good transparency. Thus, when a hardmask including the GQDs according to embodiments is used, an alignment mark may be easily detected during patterning of a target etching layer, so that a finer, more uniform pattern may be formed. The hardmask may also have improved etching resistance.

In the hardmask composition according to embodiments, any solvent capable of dispersing GQDs, a diene, or a dienophile may be used. For example, the solvent may be at least one selected from water, an alcoholic solvent, and an organic solvent.

The solvent may be, for example, at least one selected from among water, methanol, ethanol, isopropanol, N,N-dimethylformamide, N-methyl-2-pyrrolidone, dichloroethane, dichlorobenzene, dimethylsulfoxide, xylene, aniline, propylene glycol, propylene glycol diacetate, 3-methoxy1, 2-propanediol, diethylene glycol, γ-butyrolactone, acetylacetone, cyclohexanone, propylene glycol, monomethyl ether acetate, dichloroethane, O-dichlorobenzeneee, nitromethane, tetrahydrofuran, nitrobenzene, butyl nitrite, methyl cellosolve, ethyl cellosolve, diethylether, diethylene glycol methyl ether, diethylene glycol ethyl ether, dipropylene glycol methyl ether, toluene, xylene, hexane, methylethylketone, methyl isobutyl ketone, hydroxymethylcellulose, propylene glycol monomethylether acetate (PGMEA), propylene glycol monomethyl ether (PGME), cyclohexanone, ethyl lactate, and heptane.

The amount of the solvent may be about 100 parts to about 100,000 parts by weight based on 100 parts by weight of a total weight of the GQDs. When the amount of the solvent is within this range, the hardmask composition may have an appropriate viscosity and thus improved film formability.

The hardmask composition according to one or more embodiments may have improved stability.

The hardmask composition may further include, as an additional ingredient, at least one first material selected from an aromatic ring-containing monomer and a polymer containing a repeating unit including an aromatic ring-containing monomer; a second material including at least one selected from the group consisting of a hexagonal boron nitride derivative, a metal chalcogenide material, a hexagonal boron nitride derivative precursor, and a metal chalcogenide material precursor; at least one third material selected from a silicon derivative and a metal oxide; at least one fourth material selected from among a 2-dimensional (2D) carbon nanostructure, a zero-dimensional (0D) carbon nanostructure, a 2D carbon nanostructure precursor and a 0D carbon nanostructure precursor; or a combination thereof.

When the hardmask composition according to one or more embodiments further includes an additional ingredient as described above, a mixed weight ratio of the graphene quantum dots to the additional ingredient may be about 1:1 to about 1:20, and in some embodiments, about 1:1 to about 1:10, and in some other embodiments, about 1:2 to about 1:8, and in still other embodiments, about 1:3 to about 1:5.

In some embodiments, the hardmask composition may further include at least one selected from a zero-dimensional (0D) carbon nanostructure and a precursor thereof.

The term "zero-dimensional (0D) carbon nanostructure" may be, for example, a fullerene (for example, C20, C26, C28, C36, C50, C60, C70, . . . , C2n, wherein n=12, 13, 14, . . . , 100), a boron buckyball (for example, B80, B90, or B92), a carborane ($C_2B_{10}H_{12}$), or a derivative thereof. The 0D carbon nanostructure may have a particle size of about 0.6 nm to about 2 nm.

For example, the 0D carbon nanostructure may have a size of about 1 nm or less, and in some embodiments, about 0.7 nm to about 1 nm, and a density of about 1.5 g/cm³ to about 1.8 g/cm³. For example, the 0D carbon nanostructure may be a fullerene having a density of about 1.7 g/cm³. The fullerene may include sp² carbons.

In the 0D carbon nanostructure, the number of carbons may be about 26 or greater, in some embodiments, about 60 or greater, and in some other embodiments, about 60, 70, 76, 78, 82, 82, or 84. The precursor of the 0D carbon nanostructure may refer to a starting material used to form the 0D carbon nanostructure. The term "2-dimensional (2D) carbon nanostructure" may be at least one selected from graphene, reduced graphene oxide, a derivative thereof, and a heteroatom derivative thereof, and the term "0D carbon nanostructure" may be construed as including at least one selected from among a fullerene, a boron buckyball, a carborane, and derivatives thereof.

The first material may not be combined with the second material, or the first material may be combined with the second material via chemical bonding. The first material and the second material combined via chemical bonding may form a composite structure. The first material and the second material having the aforementioned functional groups may be bound to each other through chemical bonding.

The chemical bonding may be, for example, a covalent bond. The covalent bond may include at least one selected from an ester group (—C(=O)O—), an ether group (—O—), a thioether group (—S—), a carbonyl group (—C(=O)—), and an amide group (—C(=O)NH—).

The first material and the second material may include at least one selected from the group consisting of a hydroxyl group, a carboxyl group, an amino group, —Si(R₁)(R₂)(R₃) (wherein R₁, R₂, and R₃ are each independently one of hydrogen, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —SCH₃, a glycidyloxy group, a halogen atom, an isocyanate group, an aldehyde group, an epoxy group, an imino group, a urethane group, an ester group, an amide group, an imide group, an acryl group, a methacryl group, —(CH₂)ₙCOOH (wherein n is an integer from 1 to 10), —CONH₂, a $C_1$-$C_{30}$ saturated organic group having a photosensitive functional group, and a $C_1$-$C_{30}$ unsaturated organic group having a photosensitive functional group.

For example, the aromatic ring-containing monomer may be a monomer represented by Formula 8.

[Formula 8]

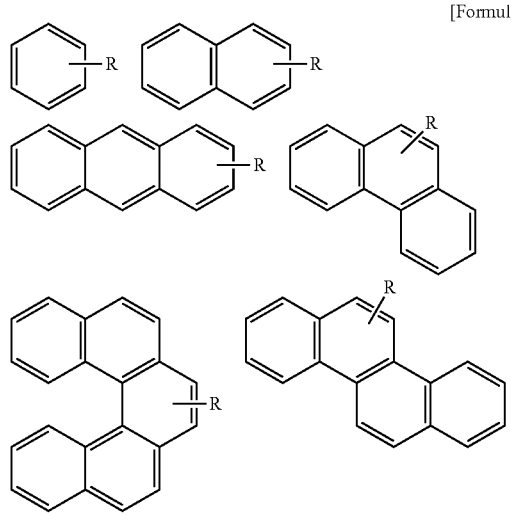
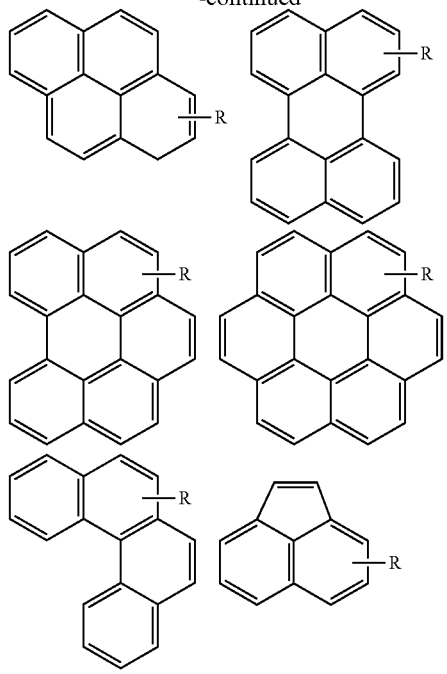

In Formula 8, R may be a mono-substituted or a multi-substituted substituent that is at least one selected from the group consisting of hydrogen, a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, a methacryl group, a substituted or unsubstituted $C_1$-$C_{30}$ saturated organic group, and a substituted or unsubstituted $C_1$-$C_{30}$ unsaturated organic group.

R may be a general photosensitive functional group, in addition to the foregoing groups.

The $C_1$-$C_{30}$ saturated organic group and the $C_1$-$C_{30}$ unsaturated organic group may have a photosensitive functional group. Examples of the photosensitive functional group may include an epoxy group, an amide group, an imide group, a urethane group, and an aldehyde group.

Examples of the $C_1$-$C_{30}$ saturated organic group and the $C_1$-$C_{30}$ unsaturated organic group may include a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbocyclic group, a substituted or unsubstituted $C_4$-$C_{30}$ carbocyclic-oxy group, and a substituted or unsubstituted $C_2$-$C_{30}$ heterocyclic group.

In Formula 8, a binding site of R is not limited. Although only one R is included in Formula 8 for convenience of description, R may be substituted at any site where substitution is possible.

For example, the aromatic ring-containing monomer may be a monomer represented by Formula 9.

A-L-A' [Formula 9]

In Formula 9, A and A' may be identical to or different from each other and may independently be a monovalent organic group derived from one selected from the monomers represented by Formula 8; and L may be a linker which may be a single bond or selected from the group consisting of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylene-alkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylene-alkylene group, a substituted or unsubstituted $C_1$-$C_{30}$ alkylene-oxy group, a substituted or unsubstituted $C_7$-$C_{30}$ arylene-alkylene-oxy group, a substituted or unsubstituted $C_6$-$C_{30}$ arylene-oxy group, a substituted or unsubstituted $C_2$-$C_{30}$ heteroarylene-oxy group, a substituted or unsubstituted $C_2$-$C_{30}$ heteroarylene-alkylene-oxy group, —C(=O)—, and —$SO_2$—.

In L, the substituted $C_1$-$C_{30}$ alkylene group, the substituted $C_2$-$C_{30}$ alkenylene group, the substituted $C_2$-$C_{30}$ alkynylene group, the substituted $C_7$-$C_{30}$ arylene-alkylene group, the substituted $C_6$-$C_{30}$ arylene group, the substituted $C_2$-$C_{30}$ heteroarylene group, the substituted $C_2$-$C_{30}$ heteroarylene-alkylene group, the substituted $C_1$-$C_{30}$ alkylene-oxy group, the substituted $C_7$-$C_{30}$ arylene-alkylene-oxy group, the substituted $C_6$-$C_{30}$ arylene-oxy group, the substituted $C_2$-$C_{30}$ heteroarylene-oxy group, the substituted $C_2$-$C_{30}$ heteroarylene-alkylene-oxy group may be substituted with at least one substituent selected from a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, and a methacryl group, or may be substituted with a photosensitive functional group.

The first material may be at least one selected from the group consisting of a compound represented by Formula 10 and a compound represented by Formula 11.

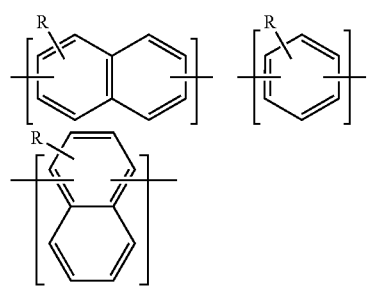

[Formula 10]

In Formula 10, R may be defined the same as in Formula 8.

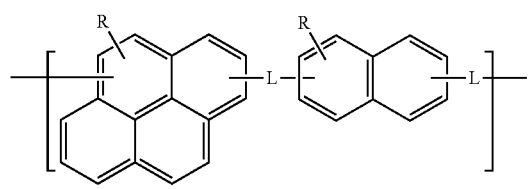

[Formula 11]

In Formula 11, R may be defined the same as in Formula 8, and L may be defined the same as in Formula 6.

In Formulae 10 and 11, a binding site of R is not limited. Although only one R is included in Formulae 10 and 11 for convenience of description, R may be substituted at any site where substitution is possible.

A weight average molecular weight of the polymer containing a repeating unit including an aromatic ring-containing monomer may be about 300 to about 30,000. When a polymer having a weight average molecular weight within this range is used, a thin film may be more easily formed, and a transparent hardmask may be manufactured.

In one or more embodiments, the first material may be a compound represented by Formula 12.

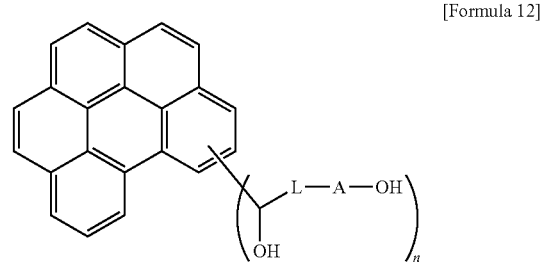

[Formula 12]

In Formula 12, A may be a substituted or unsubstituted $C_6$-$C_{30}$ arylene group; L may be a single bond or a substituted or unsubstituted $C_1$-$C_6$ alkylene group; and n may be an integer from 1 to 5.

The arylene group may be one selected from groups represented by Group 1.

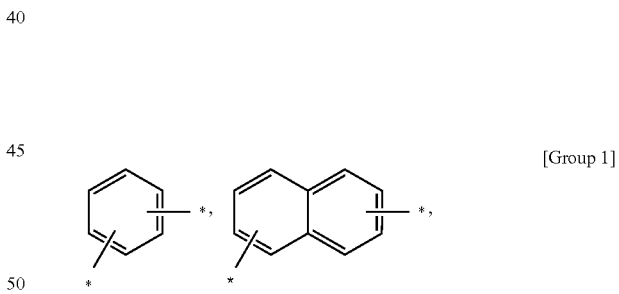

[Group 1]

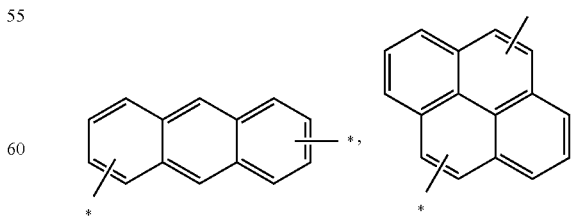

In some embodiments, the compound of Formula 12 may be one selected from compounds represented by Formulae 12a or 12b.

[Formula 12a]

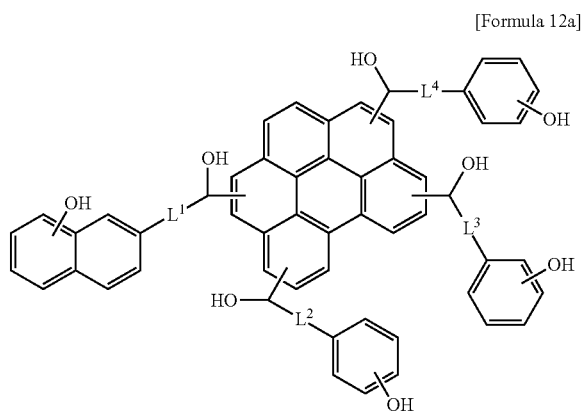

[Formula 12b]

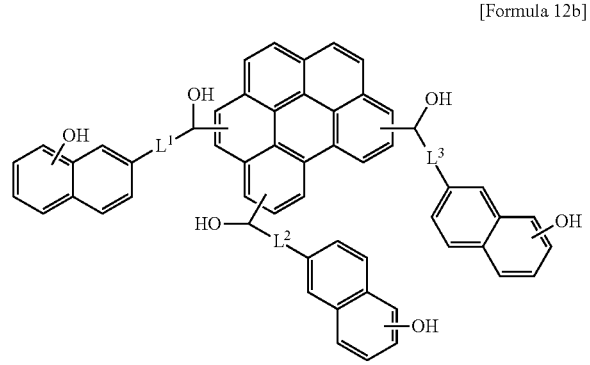

In Formulae 12a, and 12b, $L^1$ to $L^4$ may each independently be a single bond or a substituted or unsubstituted $C_1$-$C_6$ alkylene group.

The first material may be selected from compounds represented by Formulae 12c to 12e.

[Formula 12c]

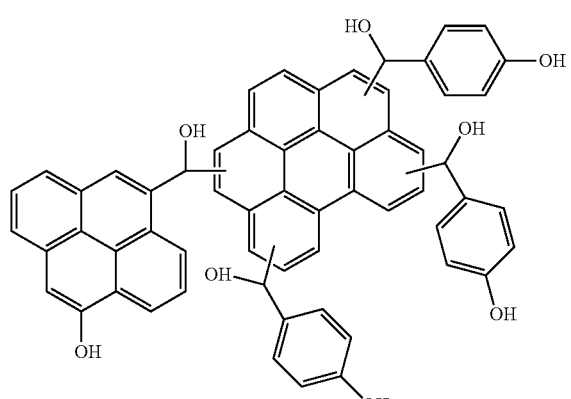

[Formula 12d]

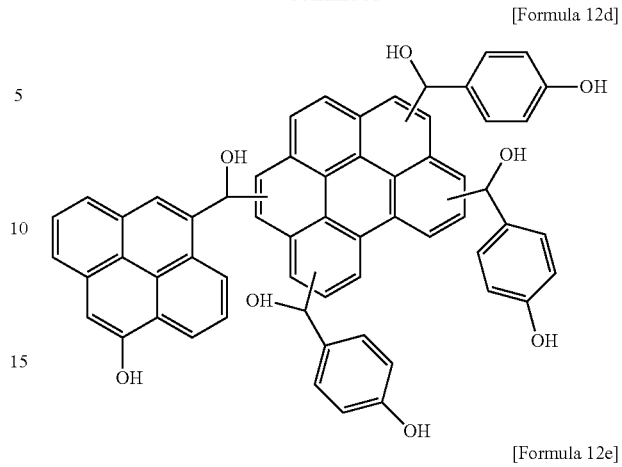

[Formula 12e]

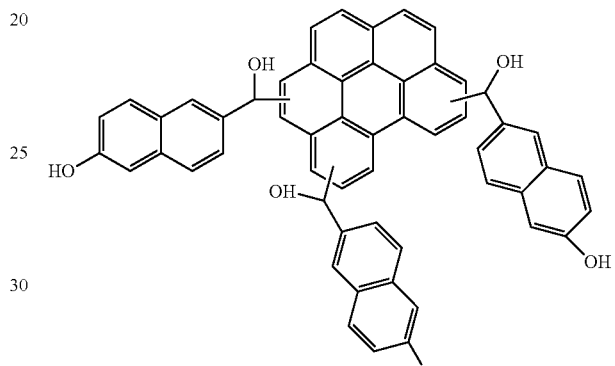

The first material may be a copolymer represented by Formula 13.

[Formula 13]

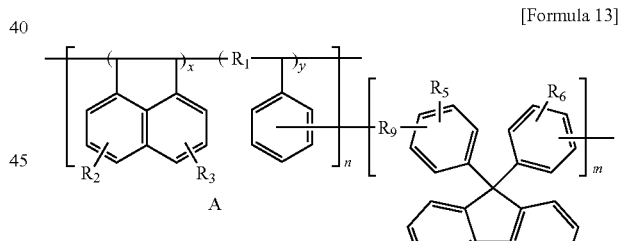

The first material may be a copolymer represented by Formula 13.

In Formula 13, $R_1$ may be a $C_1$-$C_4$ substituted or unsubstituted alkylene; $R_2$, $R_3$, $R_7$, and $R_8$ may each independently be hydrogen, a hydroxy group, a $C_1$-$C_{10}$ linear or branched cycloalkyl group, an $C_1$-$C_{10}$ alkoxy group, a $C_6$-$C_{30}$ aryl group, or a mixture thereof; $R_4$, $R_5$, and $R_6$ may each independently be hydrogen, a hydroxy group, a $C_1$-$C_4$ alkyl ether group, a phenyldialkylene ether group, or a mixture thereof; and $R_9$ may be a $C_1$-$C_{10}$ alkylene group, a $C_8$-$C_{20}$ phenyldialkylene group, a $C_8$-$C_{20}$ hydroxyphenylalkylene group, or a mixture thereof, wherein x and y may each independently be a mole fraction of two repeating units in part A which is about 0 to about 1, where x+y=1; n may be an integer from 1 to 200; and m may be an integer from 1 to 200.

The second material may be a polymer represented by Formula 13a, or 13b.

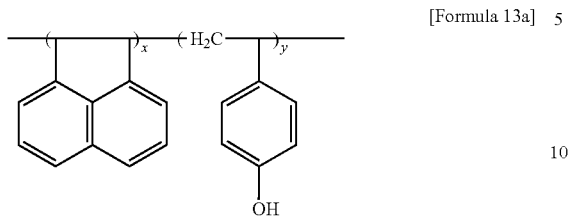
[Formula 13a]

In Formula 13a, x may be 0.2, and y may be 0.8.

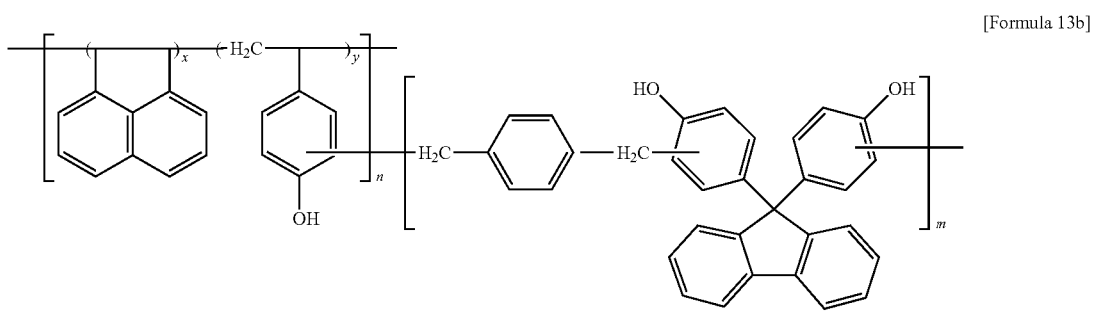
[Formula 13b]

In Formula 13b, x may be 0.2, y may be 0.8, n=90, and m=10.

The first material may be a copolymer represented by Formula 14 or 15.

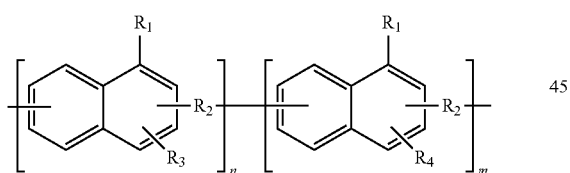
[Formula 14]

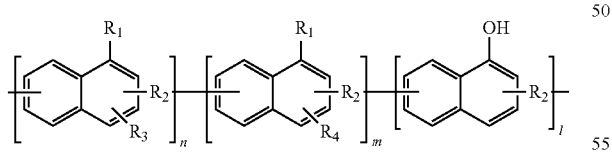
[Formula 15]

In Formulae 14 and 15, m and n may each independently be an integer from 1 to 190, $R_1$ may be one selected from hydrogen (—H), a hydroxy group (—OH), a $C_1$-$C_{10}$ alkyl group, a $C_6$-$C_{10}$ aryl group, an aryl group, and a halogen atom, $R_2$ may be one of a group represented by Formula 14A, a phenyl group, a chrysene group, a pyrene group, a fluoroanthene group, an anthrone group, a benzophenone group, a thioxanthone group, an anthracene group, and derivatives thereof; $R_3$ may be a conjugated diene; and $R_4$ may be an unsaturated dienophile.

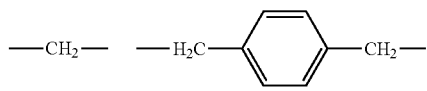
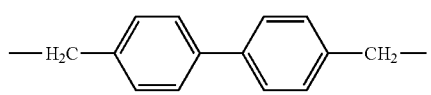
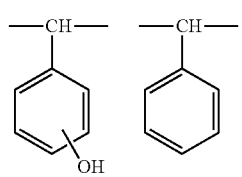
[Formula 14A]

In Formulae 14 and 15, $R_3$ may be, for example, a 1,3-butadienyl group or a 1,6-cyclopentadienylmethyl group, and $R_4$ may be, for example, a vinyl group or a cyclopentenylmethyl group.

The copolymer may be a polymer selected from polymers represented by Formulae 16 to 19.

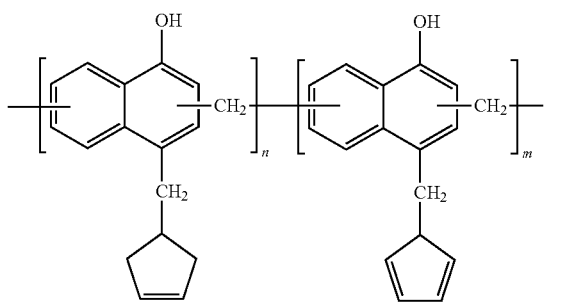

[Formula 16]

In Formula 16, m+n=21, a weight average molecular weight (Mw) may be about 10,000, and a polydispersity may be 2.1.

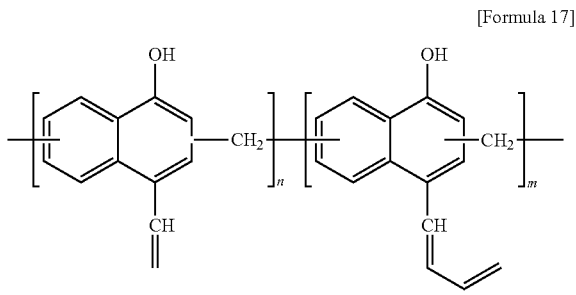

[Formula 17]

In Formula 17, a weight average molecular weight (Mw) may be about 11,000, a polydispersity may be 2.1, and m+n=21.

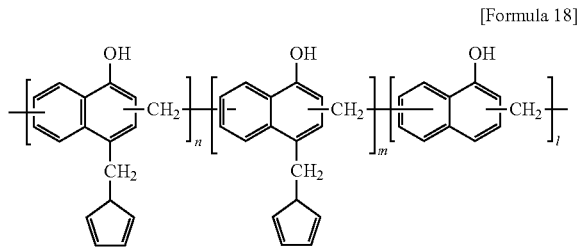

[Formula 18]

In Formula 18, a weight average molecular weight (Mw) may be about 10,000, a polydispersity may be 1.9, l+m+n=21, and n+m:l=2:1.

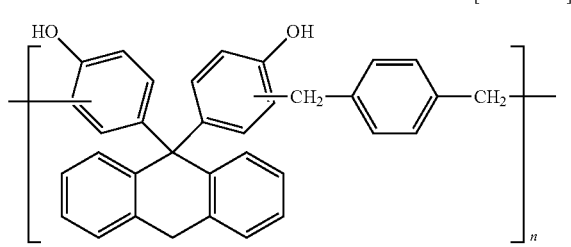

[Formula 19]

In Formula 19, a weight average molecular weight (Mw) may be about 10,000, a polydispersity may be about 2.0, and n may be about 20.

The GQDs prepared using the method according to any of the embodiments may have a low reactivity to an etching gas, for example, a $C_xF_y$ gas, used for etching a material layer such as a $SiO_2$ or SiN layer, and thus improve etching resistance. When using a $SF_6$ or $XeF_6$ gas as an etching gas having a low reactivity to $SiO_2$ or $SiN_x$, ashing may be facilitated due to improved etching characteristics. In addition, since the GQDs as a material having a band gap has transparency, the etching process may be facilitated without need to use an additional alignment mark.

In the hardmask composition according to embodiments, the hexagonal boron nitride derivative is a hexagonal boron nitride (h-BN) or a hexagonal boron carbonitride (h-$B_xC_yN_z$) (wherein the sum of x, y, and z may be 3). In the hexagonal boron nitride derivative, boron and nitrogen atoms may be included in a regular fashion in a hexagonal ring, or some of the boron and nitrogen atoms may be substituted with carbon atoms while the hexagonal ring is maintained.

In the hardmask composition according to embodiments, the metal chalcogenide material may be a compound including at least one Group 16 (chalcogens) element and at least one electropositive element. For example, the metal chalcogenide material may include at least one metal element selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge) and lead (Pb), and at least one chalcogen element selected from sulfur (S), selenium (Se), and tellurium (Te).

The metal chalcogenide material may be selected from molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride ($WTe_2$). In some embodiments, the metal chalcogenide material may be molybdenum sulfide ($MoS_2$).

The hexagonal boron nitride derivative may have a flat hexagonal crystal structure, the vertices of which are occupied alternatively by boron and nitrogen atoms. A layered structure of the hexagonal boron nitride is a structure in which adjacent boron and nitrogen atoms overlap each other due to their polarities, which is also called "a AB stacking" structure. The hexagonal boron nitride derivative may have a layered structure of nanoscale thin sheets stacked one upon another, or may include a single layer or multiple layers of hexagonal boron nitride sheets separated or delaminated from the layered structure.

The hexagonal boron nitride derivative according to one or more embodiments may have a peak at about 1360 cm$^{-1}$ in the Raman spectra. This location of the peak may give information about the number of layers in the hexagonal boron nitride derivative. Through atomic force microscope (AFM) analysis, Raman spectroscopy analysis, transmission electron microscope (TEM) analysis, or the like, it may be found that the hexagonal boron nitride derivative has a single-layered or multilayered nanosheet structure.

According to a result of X-ray diffraction analysis with CuKα radiation, the hexagonal boron nitride derivative may include a 2-dimensional (2D) layered structure having a (002) crystal plane peak. The (002) crystal plane peak may be observed in a range of about 20° to about 27°.

An interlayer distance (d-spacing) of the hexagonal boron nitride derivative obtained by X-ray diffraction analysis may be in a range of about 0.3 nm to about 0.7 nm, for example, about 0.334 nm to about 0.478 nm. An average particle diameter of crystals of the hexagonal boron nitride derivative obtained by X-ray diffraction analysis may be about 1 nm or greater, for example, in a range of about 23.7

Angstroms (Å) to about 43.9 Å. When the interlayer distance (d-spacing) is within this range, the hardmask composition may have improved etching resistance.

The hexagonal boron nitride may include a single layer of 2D boron nitride or a stack of multiple layers of 2D boron nitride.

Hereinafter, a method of forming a hardmask by using the hardmask composition according to any of the embodiments will be described in detail.

In some embodiments, the hardmask composition may include graphene quantum dots (GQDs) according to any of the above-described embodiments and a solvent. In some other embodiments, the hardmask composition may include GQDs prepared using a method according any of the above-described method and a solvent.

The hardmask composition may be coated on a target etching layer and then dried to form a hardmask according to some example embodiments.

The GQDs may be, for example, COOH-functionalized GQDs, OH-functionalized GQDs, $NH_2$-functionalized GQDs, or precursors of these functionalized GQDs.

Optionally, during or after the process of coating the hardmask composition on the target etching layer, heat treatment may be performed. The heat treatment may also be omitted. Conditions for the heat treatment may be varied depending on a material of the target etching layer. For example, the heat treatment may be performed at a temperature ranging from room temperature (about 20° C. to 25° C.) to about 1500° C.

The heat treatment may be performed in an inert gas atmosphere or in vacuum.

The heat treatment may be performed using induction heating, radiant heat, lasers, infrared rays, microwaves, plasma, ultraviolet rays, or surface plasmon heating as a heat source.

The inert gas atmosphere may be created by using a mixture a nitrogen gas and/or an argon gas.

After the thermal treatment of removing the solvent, a process of c-axial alignment of GQDs may be performed).

After the heat treatment, the solvent may be removed. The resulting product of removing the solvent through or without the thermal treatment may be subjected to a baking process at a temperature of about 400° C. or lower, for example, about 100° C. to about 400° C. After the thermal treatment, further heat treatment may be performed at a temperature of about 800° C. or lower, for example, in a range of about 400° C. to about 800° C.

A thermal reduction process may occur during the heat treatment. Through the thermal reduction process, an oxygen content of the GQDs may be reduced.

In some embodiments, the baking process may be omitted, and only the thermal treatment may be performed.

When the temperatures of the heat treatment and the baking process are within the above ranges, a hardmask having improved etching resistance may be formed.

In the thermal treatment and the baking process, a temperature increasing rate may be about 1° C./min to about 10° C./min. When the temperature increasing rate is within this range, process efficiency may be improved without concern about damage of a deposited layer from sudden temperature changes.

In some embodiments, the hardmask may have a thickness of about 10 nm to about 10,000 nm.

FIG. 1 is a schematic illustration of graphene quantum dots according to some example embodiments of inventive concepts.

In FIG. 1, reference numeral 1 denotes the graphene quantum dots. The graphene quantum dots 1 may have at an edge thereof at least one first functional group G (denoted by reference numeral 2) selected from the group consisting of a hydroxyl group, a carbonyl group, a carboxyl group, an epoxy group, an amine group, as illustrated in FIG. 1.

Hereinafter, embodiments of a method of forming a pattern by using a hardmask composition according to some example embodiments will be described with reference to FIGS. 2A to 2E.

Figure 2A:
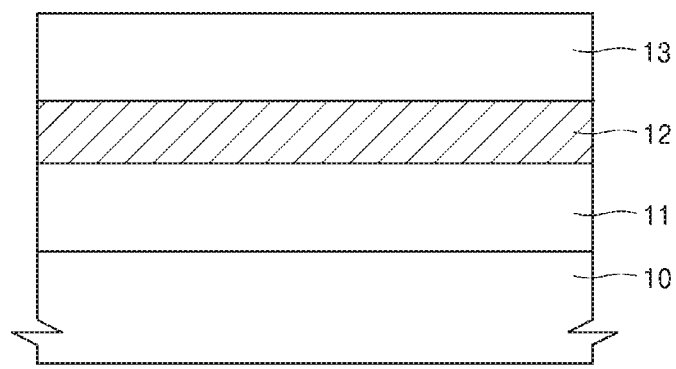
FIGS. 2A to 2E are cross-sectional views for explaining a method of forming a pattern, according to some example embodiments, using a hardmask composition according to some example embodiments.

Referring to FIG. 2A, a target etching layer 11 to be etched may be formed on a substrate 10. A hardmask composition according to any of the above-described embodiments may be provided on the target etching layer 11 in order to form a hardmask layer 12.

The process of providing the hardmask composition may be performed by one method selected from spin coating, air spraying, electrospraying, dip coating, spray coating, doctor-blade coating, and bar coating In some embodiments, the providing of the hardmask composition may be performed by using a spin-on coating method. The hardmask composition may be coated on the substrate 10 to a thickness of, for example, in a range of about 10 nm to about 10,000 nm, or about 10 nm to about 1,000 nm. However, embodiments are not limited thereto.

The substrate 10 is not particularly limited. For example, the substrate 10 may be at least one selected from a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 may be formed on the hardmask layer 12.

Figure 2B:
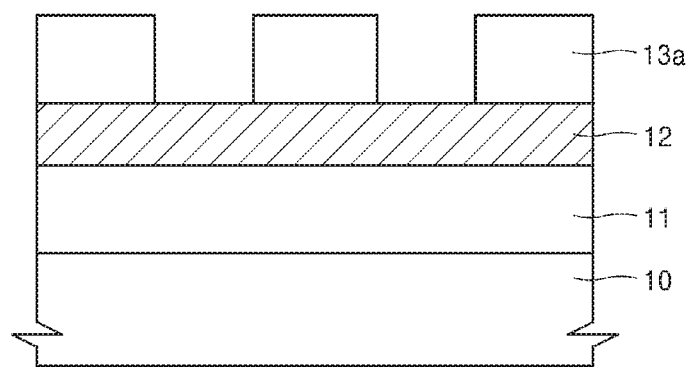

Referring to FIG. 2B, a photoresist pattern 13a may be formed by exposing and developing the photoresist layer 13 by using a common method in the art.

The process of exposing the photoresist layer 13 may be performed by using, for example, argon fluoride (ArF), krypton fluoride (KrF), or extreme ultraviolet (EUV) laser. After the exposure process, a heat treatment may be performed at a temperature in a range of about 200° C. to about 500° C.

In the developing process, a developing solution such as an aqueous solution of tetramethylammonium hydroxide (TMAH) may be used.

Figure 2C:
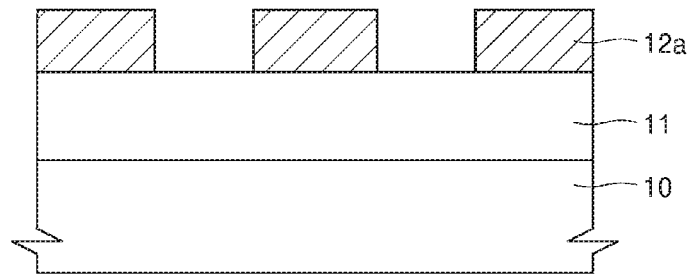

Next, the hardmask layer 12 may be etched by using the photoresist pattern 13a as an etch mask, to thereby form a hardmask pattern 12a on the target etching layer 11 (see FIG. 2C).

A thickness of the hardmask pattern 12a may be in a range of about 10 nm to about 10,000 nm. When the thickness of the hardmask pattern 12a is within this range, the hardmask pattern 12a may have improved film uniformity and improved etching resistance.

For example, the etching process may be performed by using a dry etching method using an etching gas. Examples of the etching gas may include at least one selected from $CF_4$, $CHF_3$, $Cl_2$, and $BCl_3$.

In some embodiments, when a mixture gas of $C_4F_8$ and $CHF_3$ is used as the etching gas, a mixing ratio of $C_4F_8$ and $CHF_3$ may be in a range of about 1:10 to about 10:1 by volume.

The target etching layer 11 may be patterned into a plurality of patterns. The plurality of patterns may include various types of patterns, for example, a metal pattern, a semiconductor pattern, and an insulating pattern. For example, the plurality of patterns may be used as various patterns in a semiconductor integrated circuit device.

The target etching layer 11 may be formed of a material of a target final pattern. For example, the target etching layer 11 may be a metal layer including aluminum or copper, a semiconductor layer including silicon, or an insulating layer including silicon oxide or silicon nitride. The target etching layer 11 may be formed by using various methods such as sputtering, electronic beam deposition, chemical vapor deposition, or physical vapor deposition. For example, the target etching layer 11 may be formed by using a chemical vapor deposition method.

Figure 2D:
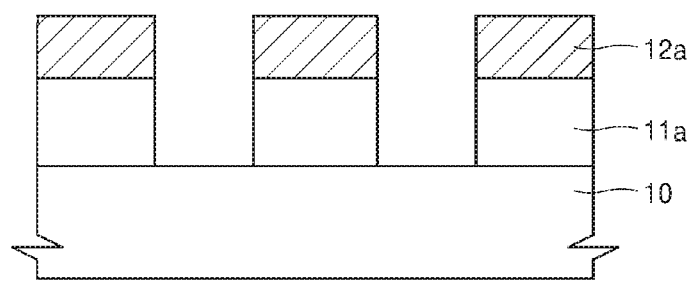
Figure 2E:
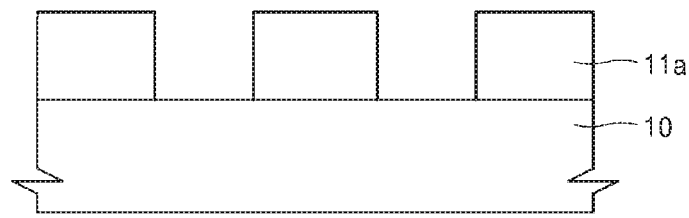

Referring to FIGS. 2D and 2E, the target etching layer 11 may be etched by using the hardmask pattern 12a as an etch mask to form a target etching layer pattern 11a having a desired fine pattern.

When the hardmask composition according to one or more embodiments is used, a solution process may be applicable without need for additional coating equipment, ashing-off under oxygen atmosphere may be facilitated, and the resulting pattern may have improved physical characteristics.

In some embodiments, the hardmask may include a product of coating and thermally treating the hardmask composition according to one or more embodiments.

The hardmask according to one or more embodiments may be used as an etch mask or as a stopper in the manufacture of a semiconductor device by being disposed between other layers.

Hereinafter, a method of forming a pattern by using a hardmask composition according to one or more embodiments will be described with reference to FIGS. 3A to 3D.

Figure 3A:
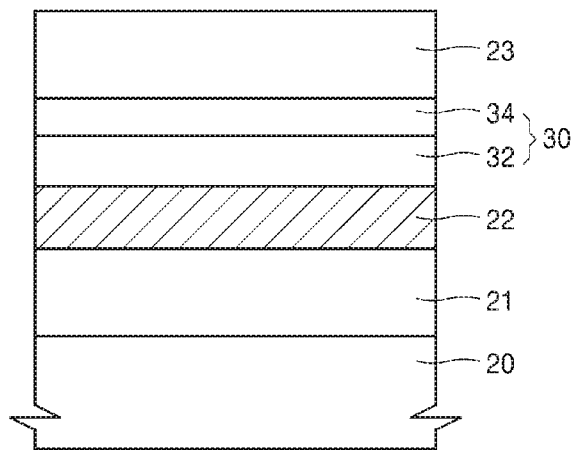
FIGS. 3A to 3D are cross-sectional views for explaining a method of forming a pattern, according to another embodiment, using a hardmask composition according to some example embodiments.

Referring to FIG. 3A, a target etching layer 21 may be formed on a substrate 20. The substrate 20 may be a silicon substrate.

The target etching layer 21 may be formed as, for example, a silicon oxide layer, a silicon nitride layer, a silicon nitroxide layer, a silicon carbide (SiC) layer, or a derivative layer thereof. Then, a hardmask composition according to some example embodiments may be provided on the target etching layer 21 to form a hardmask layer 22.

Figure 3B:
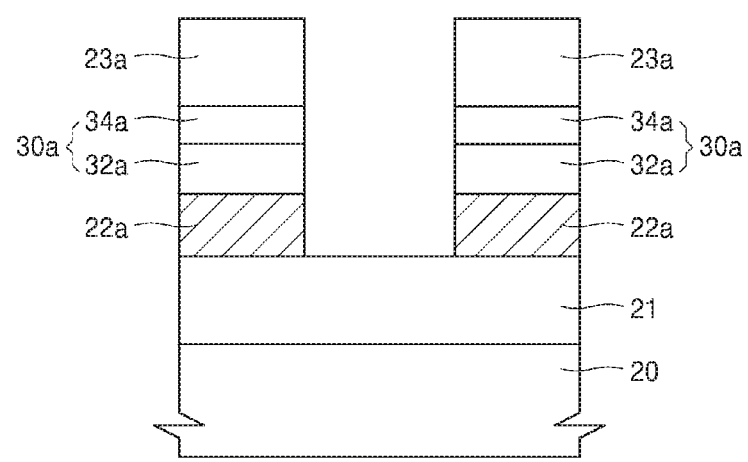
Figure 3C:
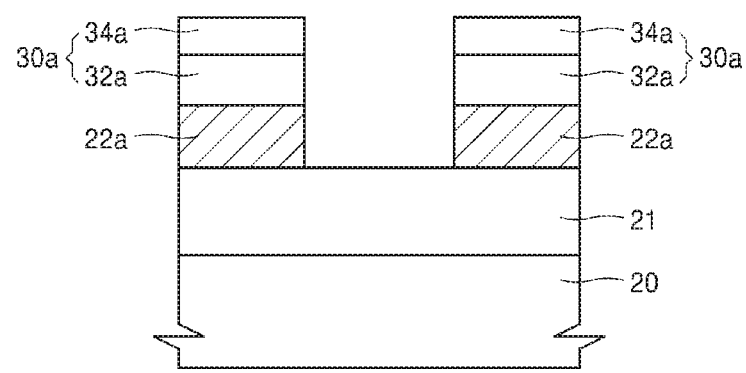

An anti-reflection layer 30 may be formed on the hardmask layer 22. The anti-reflection layer 30 may be an inorganic anti-reflection layer, an organic anti-reflection layer, or a combination thereof. FIGS. 3A to 3C illustrate embodiments in which the anti-reflection layer 30 includes an inorganic anti-reflection layer 32 and an organic anti-reflection layer 34.

The inorganic anti-reflection layer 32 may be, for example, a SiON layer. The organic anti-reflection layer 34 may be a polymer layer commonly used in the art having an appropriate refractive index and a high absorption coefficient with respect to a wavelength of light to which a photoresist is exposed. A thickness of the anti-reflection layer 30 may be, for example, in a range of about 100 nm to about 500 nm.

Next, a photoresist layer 23 may be formed on the anti-reflection layer 30.

The photoresist layer 23 may be exposed to light and then developed using a common method, to thereby form a photoresist pattern 23a. Then, the anti-reflection layer 30 and the hardmask layer 22 may be sequentially etched by using the photoresist pattern 23a as an etch mask to form a hardmask pattern 22a on the target etching layer 21. The hardmask pattern 22a may include an inorganic anti-reflection pattern 32a and an organic anti-reflection pattern 34a.

Although in FIG. 3B the photoresist pattern 23a and an anti-reflection pattern 30a are remaining on the hardmask pattern 22a after the formation of the hardmask pattern 22a, the photoresist pattern 23a and the anti-reflection pattern 30a may be partially or completely removed during the etching process for forming the hardmask pattern 22a.

FIG. 3C illustrates the state after removing only the photoresist pattern 23a.

Figure 3D:
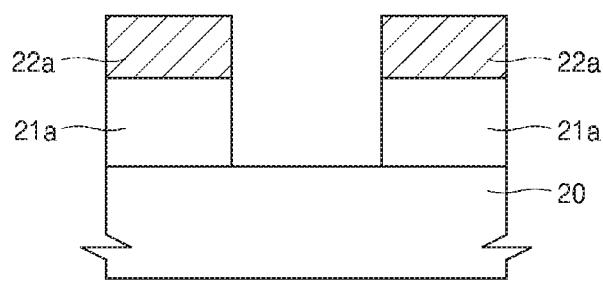

The target etching layer 21 may be etched by using the hardmask pattern 22a as an etch mask to form a desired layer pattern, which is a target etching layer pattern 21a (see FIG. 3D).

As described above, the hardmask pattern 22a may be removed after the target etching layer pattern 21 is formed. According to one or more embodiments, the hardmask pattern 22a may be easily removed by using a common method in the art, and almost no residue remains after the hardmask pattern 22a is removed.

Using the hardmask composition according to the one or more embodiments, a hardmask which may be easily removed after an etching process may be formed. When using this hardmask, a fine pattern having an improved uniformity may be formed, and efficiency of semiconductor manufacturing processes may be improved.

The removing of the hardmask pattern 22a may be performed by, but not limited to, $O_2$ ashing and wet stripping. For example, the wet stripping may be performed using alcohol, acetone, or a mixture of nitric acid and sulfuric acid.

The GQDs in the hardmask formed according to the above processes may have a higher content of $sp^2$ carbon structures than $sp^3$ carbon structures, and thus the hardmask may have sufficient resistance to dry etching. The hardmask may also have improved transparency, and thus an alignment mark for patterning may be easily detected.

According to some example embodiments of inventive concepts, a hardmask formed using a hardmask composition according to any of the embodiments may be used in manufacturing and designing an integrated circuit device according in a semiconductor device manufacturing process. For example, the pattern may be used in forming a patterned material layer structure such as metal wirings, holes for contact or bias, insulation sections (for example, a damascene trench (DT) or shallow trench isolation (STI)), or a trench for a capacitor structure.

In some embodiments, the hardmask may have a density of about 2.0 $g/cm^3$ or greater, for example, about 2.0 $g/cm^3$ to about 2.2 $g/cm^3$.

One or more embodiments of the present disclosure will now be described in detail with reference to the following examples. However, these examples are only for illustrative purposes and are not intended to limit the scope of the one or more embodiments of the present disclosure.

PREPARATION EXAMPLE 1

Preparation of GQDs 1,3,6-trinitropyrene was mixed with N-methyl-2-pyrrolidone (NMP) to obtain a graphene quantum dot composition containing 10% by weight of 1,3,6-trinitropyrene(TNP). The graphene quantum dot composition was thermally treated at about 200° C. under atmospheric pressure for about 24 hours.

Once the reaction was complete after the thermal treatment, the resultant was centrifuged using a centrifugal filter (8,000 nominal molecular weight limit (NMWL) and 10,000 NMWL, Amicon Ultra-15) to sort out a particle size, which was then subjected to dialysis to remove residues. Then the resultant was dried to thereby obtain graphene quantum dots (GQDs) in a sheet form with hydroxyl and amino groups bound thereto having a major-axis length of about 7 nm.

PREPARATION EXAMPLE 2

Preparation of GQDs

GQDs were obtained in the same manner as in Preparation Example 1, except that 4-(dimethylamino)pyridine (DMAP) was further added as a catalyst in an amount of about 1.5 mole % with respect to 1 mole of TNP to prepare the graphene quantum dot composition, and the thermal treatment was performed at about 200° C. under atmospheric pressure for about 10 hours.

PREPARATION EXAMPLE 3

Preparation of GQDs

GQDs were obtained in the same manner as in Preparation Example 1, except that a graphene quantum dot composition containing 5% by weight of 1,3,6-trinitropyrene was prepared.

PREPARATION EXAMPLE 4

Preparation of GQDs

GQDs were obtained in the same manner as in Preparation Example 1, except that a graphene quantum dot composition containing 30% by weight of 1,3,6-trinitropyrene was prepared.

PREPARATION EXAMPLE 5

Preparation of GQDs

GQDs in a sheet form having a major-axis length of about 7 nm were obtained in the same manner as in Preparation Example 1, except that the thermal treatment temperature was changed to about 100° C.

PREPARATION EXAMPLE 6

Preparation of COOH-Functionalized GQDs

After chloroacetic acid was added to the OH-functionalized GQDs obtained in Preparation Example 1, thermal treatment was performed at about 80° for about 60 minutes for coupling reaction, to thereby obtain COOH-functionalized GQDs having an major-axis length of about 7 nm.

PREPARATION EXAMPLES 7-8

Preparation of GQDs

GQDs were obtained in the same manner as in Preparation Example 1, except that 1,2-dinitropyrene and 1,6-dinitropyrene were used, respectively, instead of 1,3,6-trinitropyrene.

PREPARATION EXAMPLE 9

Preparation of GQDs

GQDs were obtained in the same manner as in Preparation Example 1, except that a graphene quantum dot composition containing 0.01% by weight of 1,3,6-trinitropyrene was prepared.

PREPARATION EXAMPLE 10

Preparation of GQDs

GQDs were obtained in the same manner as in Preparation Example 1, except that a graphene quantum dot composition containing 40% by weight of 1,3,6-trinitropyrene was prepared.

COMPARATIVE PREPARATION EXAMPLE 1

About 1.0 g of 1,3,6-trinitropyrene was dispersed in 0.6 L of a 0.2M NaOH aqueous solution, and then subjected to a hydrothermal reaction in an autoclave at about 250° C. for about 10 hours. The resultant was cooled down to room temperature, filtered through a microporous membrane having a pore size of about 0.22 μm to remove an insoluble carbon product, and then subjected to dialysis for about 2 hours, thereby obtaining GQDs.

EXAMPLE 1

Manufacture of Silicon Substrate Having Silicon Oxide Layer Pattern 0.5 g of the GQDs (having a size of about 7 nm) was mixed with 3 g of water to prepare a hardmask composition. This hardmask composition was spin-coated on a silicon substrate having a silicon oxide layer and then backed at about 400° C. for about 2 minutes, to thereby form a hardmask including the GQDs having a size(thickness) of about 7 nm.

An ArF photoresist (PR) was coated on the hardmask to a thickness of about 1700 Å and then pre-backed at about 110° C. for about 60 seconds. The resultant was exposed to light by using a light exposing instrument (available from ASML, XT: 1400, and NA 0.93), post-baked at a temperature of about 110° C. for about 60 seconds, and then developed by using a 2.38 wt % aqueous solution of tetramethyl ammonium hydroxide (TMAH) to form a photoresist pattern.

Dry etching was performed using the photoresist pattern as a mask and a $CF_4/CHF_3$ mixture gas. The etching conditions included 20 mT of a chamber pressure, 1800 W of a RF power, a ratio of $C_4F_8$ to $CHF_3$ in 4:10 by volume, and an etching time of about 120 seconds.

$O_2$ ashing and wet stripping were performed on a hardmask and an organic material remaining after the dry etching to thereby obtain a silicon substrate having a silicon oxide layer pattern as a final pattern.

EXAMPLES 2-10

Manufacture of Silicon Substrate Having Silicon Oxide Layer Pattern

Substrates having desired silicon oxide layer patterns were manufactured in the same manner as in Example 1, except that the hardmask compositions prepared according to Examples 2 to 10 were used, respectively, instead of the hardmask composition of Example 1.

COMPARATIVE EXAMPLE 1

Manufacture of Silicon Substrate Having Silicon Oxide Layer Pattern

A substrate having a desired silicon oxide layer pattern was manufactured in the same manner as in Example 1, except that the hardmask composition prepared according to Comparative Preparation Example 1 was used, instead of the hardmask composition of Preparation Example 1.

EVALUATION EXAMPLE 1

Gel Permeation Chromatography (GPC)

Number average molecular weights (Mn) and weight average molecular weights (Mw) of the GQDs prepared according to Preparation Examples 1 to 6 and Comparative Preparation Example 1 were measured by gel permeation chromatography (GPC), and molecular weight distributions (MWDs) of the GQDs were calculated by dividing weight average molecular weight by number average molecular weight.

The GQDs of Comparative Preparation Example 1 were found to have a weight average molecular weight (Mw) of about 500 to about 40,000, and the GQDs of Preparation Examples 1 to 6 had a weight average molecular weight (Mw) of about 1,500 to about 3,000, indicating that the GQDs of Preparation Examples 1 to 6 had a reduced molecular weight distribution (MWD), compared to the GQDs of Comparative Preparation Example 1.

EVALUATION EXAMPLE 2

Nuclear Magnetic Resonance (NMR) Analysis

The GQDs of Preparation Example 1 and Comparative Preparation Example 1 were analyzed by nuclear magnetic resonance (NMR) spectroscopy using an AVANCE DPX 300 (available from Bruker).

Figure 4:
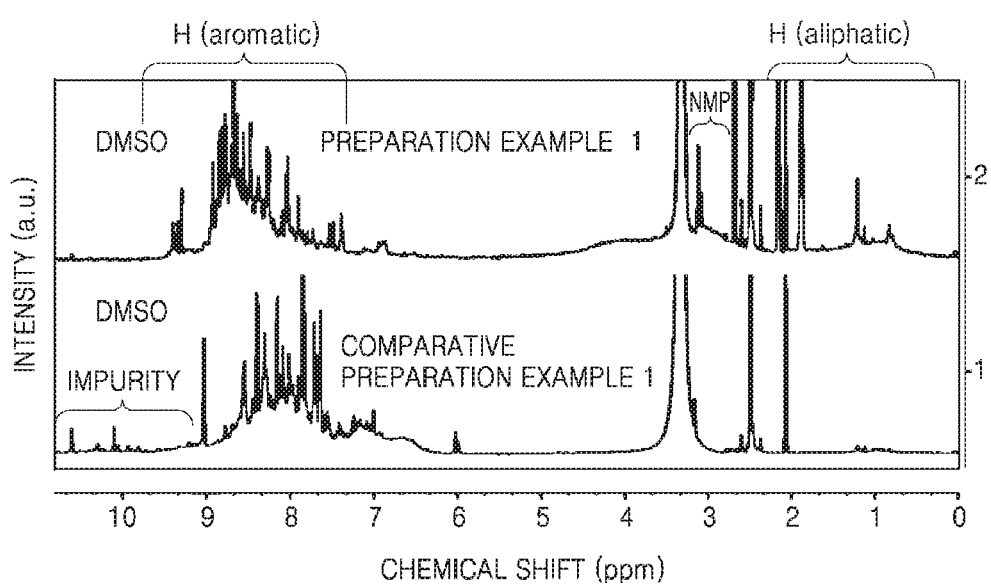
FIG. 4 illustrates nuclear magnetic resonance (NMR) spectra of graphene quantum dots prepared in Preparation Example 1 and Comparative Preparation Example 1.

The NMR analysis results of the GQDs of Preparation Example 1 and Comparative Preparation Example 1 are shown in FIG. 4. Referring to FIG. 4, the GQDs of Preparation Example 1 were found to have no peak of impurities at a chemical shift of about 9.5 ppm to 11 ppm, unlike the GQDs of Comparative Preparation Example 1, indicating that the GQDs of Preparation Example 1 had remarkably improved purity compared to the GQDs of Comparative Preparation Example 1.

EVALUATION EXAMPLE 3

Fourier-Transform Infrared (FTIR) Spectroscopy

Figure 5:
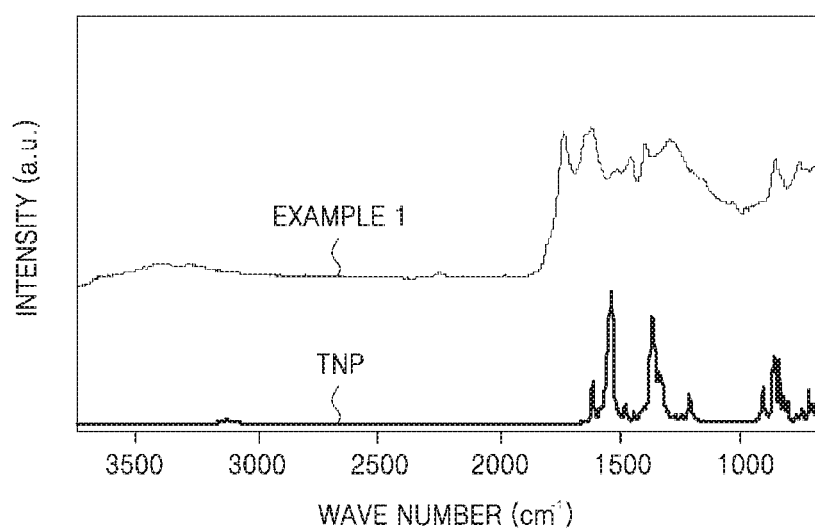
FIG. 5 illustrates results of Fourier-transform infrared (FTIR) spectroscopy on graphene quantum dots after baking in Example 1 and 1,3,6-trinitropyrene.

The hardmask after the baking in Example 1 were analyzed by Fourier-transform infrared (FTIR) spectroscopy using a Vertex 70+Hyperion 3000 (available from Bruker). The results are shown in FIG. 5. In FIG. 5, an FT-IR spectrum of 1,3,6-trinitropyrene (TNP) as a starting material is also shown.

Referring to FIG. 5, the GQDs after the baking in Example 1 were found to have a relatively reduced intensity of a peak corresponding to a hydroxyl group (TNP) at an end thereof observed at a wave number of about 2500 $cm^{-1}$ to about 3700 $cm^{-1}$, and a relatively increased intensity of peaks corresponding to C=O and C=N observed at a wave number of about 1600 $cm^{-1}$ to about 1800 $cm^{-1}$. This result indicates occurrence of carbon-carbon coupling reaction due to the increased C=C, generation of hydroxyl groups, the remaining of aromatic groups, and increased amounts of oxygen and nitrogen in the GQDs relative to TNP.

EVALUATION EXAMPLE 4

X-Ray Photoelectron Spectroscopy (XPS)

1) EXAMPLE 1 AND COMPARATIVE EXAMPLE 1

The hardmasks after the baking in Example 1 and Comparative Example 1 were analyzed by X-ray photoelectron spectroscopy (XPS) using a Quantum 2000 (available from Physical Electronics. Inc., Acceleration voltage: about 0.5~15 keV, 300 W, Energy resolution: about 1.0 eV, and Sputtering rate: about 0.1 nm/min).

The amounts of carbon, nitrogen, and oxygen in the GQDs after the baking in Example 1 and Comparative Example 1 were analyzed based on the XPS results. The results are shown in Table. 1.

TABLE 1

| Example | C (atom %) | N (atom %) | O (atom %) |
|---|---|---|---|
| Example 1 | 78 | 8 | 14 |
| Comparative Example 1 | 75 | 3 | 22 |

Referring to Table 1, the GQDs after the baking in Example 1 were found to have an increased amount of nitrogen, compared to the GQDs after the baking in Comparative Example 1. The manufactured hardmask including the GQDs according to Example 1 was found to have improved stability and improved etching selectivity.

2) PREPARATION EXAMPLE 2 AND COMPARATIVE PREPARATION EXAMPLE 1

The GQDs prepared in Preparation Example 2 and Comparative Preparation Example 1 were analyzed by XPS using a Quantum 2000 (available from Physical Electronics. Inc., Acceleration voltage: about 0.5~15 keV, 300 W, Energy resolution: about 1.0 eV, and Sputtering rate: 0.1 nm/min).

Figure 6A:
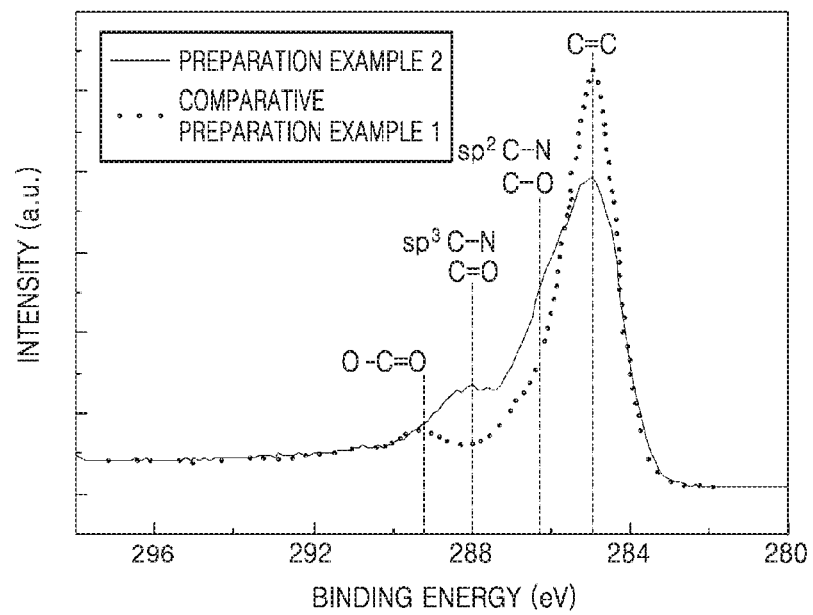
FIGS. 6A to 6C illustrate results of X-ray photoelectron spectroscopy on graphene quantum dots prepared in Preparation Example 2 and Comparative Preparation Example 1
Figure 6B:
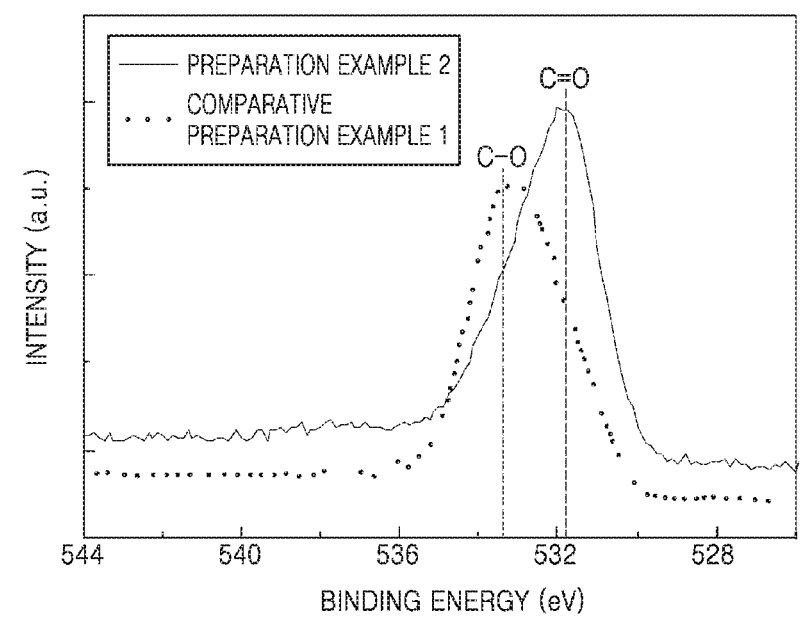
Figure 6C:
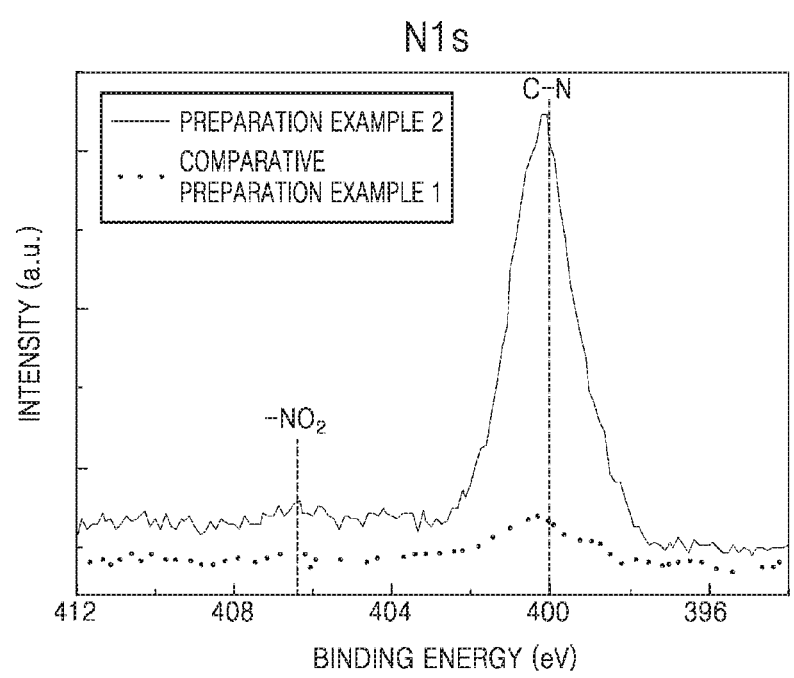

The XPS results are shown in FIGS. 6A to 6C. FIGS. 6A to 6C are XPS spectra of the GQDs prepared in Preparation Example 2 and Comparative Preparation Example 1, illustrating characteristics of peaks corresponding to C1s, O1s, and N1s, respectively.

Referring to FIG. 6A, the GQDs of Preparation Example 2 were found to have a binding energy of about 284 eV to about 290 eV at a maximum intensity of a peak corresponding to C1s, which was greater than a peak intensity corresponding to C1s of graphene quantum dots obtained by hydrothermal reaction, and to have a binding energy of about 287 eV to 289 eV of a peak corresponding to $sp^3$ C—N. However, unlike the GQDs of Preparation Example 2, the GQDs of Comparative Preparation Example 1 had no peak corresponding to $sp^3$ C—N.

Referring to FIG. 6B, a binding energy of a peak corresponding to O1s was shifted in the GQDs of Preparation Example 2 by about 0.1 eV, relative to that in the GQDs of Comparative Preparation Example 1. Referring to FIG. 6C, the GQDs of Preparation Example 2 were found to have a remarkably increased intensity of a peak corresponding to C—N bonds, relative to the GQDs of Comparative Preparation Example 1, indicating that the GQDs of Preparation Example 2 included more groups such as —$NH_2$, compared to the GQDs of Comparative Preparation Example 1.

The amounts of carbon, nitrogen, and oxygen were analyzed based on the XPS results.

EVALUATION EXAMPLE 5

Etching Resistance

Thickness differences of the hardmasks and the silicon oxide layers according to Examples 1 to 10 and Comparative Example 1 between before and after etching were evaluated. Etching resistances of the hardmasks were evaluated based on the etch rate and etching selectivity thereof calculated using Equations 1 and 2, respectively.

Etch rate=(Thin film thickness before etching−Thin film thickness after etching)/Etching time (sec)  [Equation 1]

Etch selectivity=(Silicon oxide layer's thickness before etching−Silicon oxide layer's thickness after etching)/(Hardmask's thickness before etching−Hardmask's thickness after etching)× 100  [Equation 2]

As a result of the etching resistance evaluation, the hardmasks according to Examples 1 to 10 were found to have a lower etch rate and an increased etching selectivity relative to the hardmask according to Comparative Example 13, indicating that the hardmask compositions of Examples 1 to 10 had improved etching resistance relative to the hardmask composition of Comparative Example 1.

EVALUATION EXAMPLE 6

Raman Spectroscopy

The GQDs prepared in Preparation Example 1 and Comparative Preparation Example 1, and 1,3,6-trinitropyrene (TNP) as a starting material were analyzed by Raman spectroscopy. The Raman spectroscopy results of the GQDs are shown relative to those of TNP as the starting material.

Figure 7A:
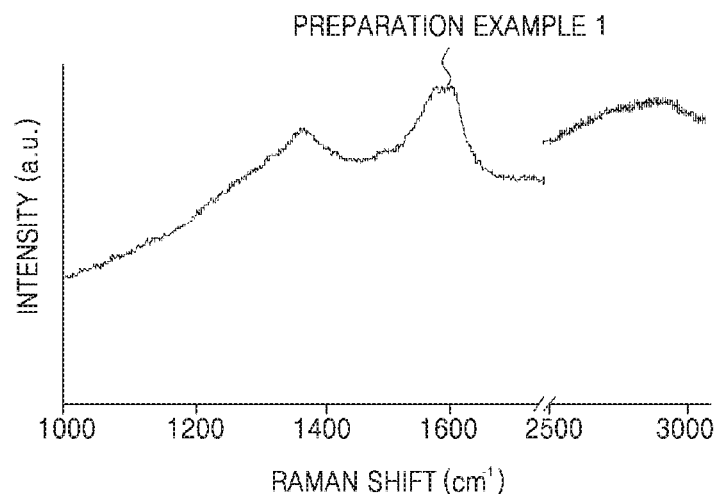
FIG. 7A illustrates results of Raman spectroscopy on graphene quantum dots prepared in Preparation Example 1.

The Raman spectroscopy results of the GQDs prepared in Preparation Example 1 are shown in FIG. 7A. The Raman spectroscopy results of the GQDs prepared in Comparative Preparation Example 1 and TNP are shown in FIG. 7B.

Figure 7B:
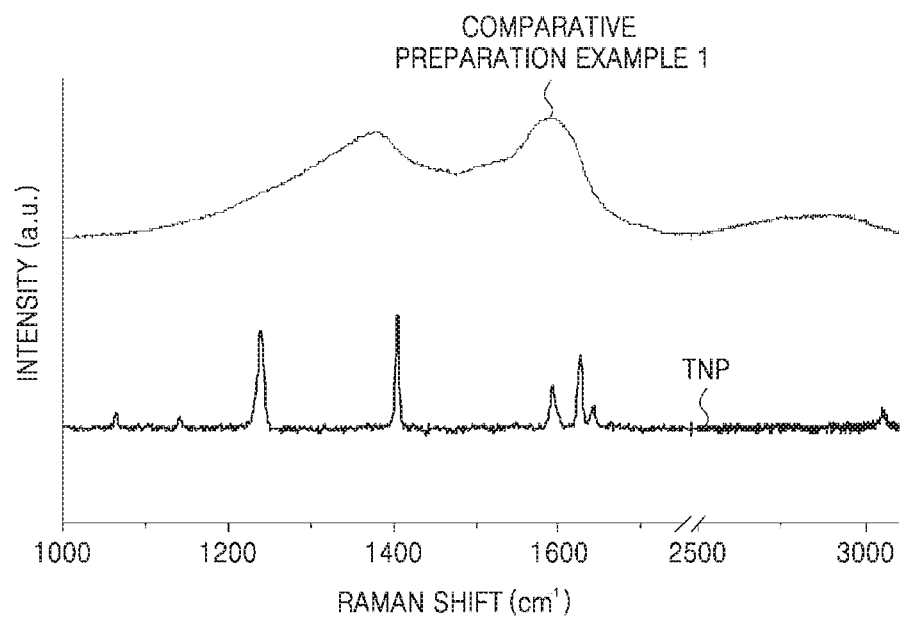
FIG. 7B illustrates results of Raman spectroscopy on graphene quantum dots prepared in Comparative Preparation Example 1 and 1,3,6-trinitropyrene (TNP)

Referring to FIGS. 7A and 7B, it was found that GQDs, like GQDs prepared in Comparative Preparation Example 1, may be prepared according to Preparation Example 1.

EVALUATION EXAMPLE 7

Transmittance

Transmittances of the hardmasks of Example 1 and Comparative Example 1 were measured at an exposure wavelength of about 633 nm.

As a result of the measurement, the hardmask pattern of Example 1 was found to have an improved transmittance of about 99% or higher, relative to the hardmask pattern of Comparative Example 1. When using such a hardmask having an improved transmittance, a hardmask pattern and an alignment mark for patterning a target etching layer may be easily detected, so that the target etching layer may be patterned into a fine and compact pattern.

FIGS. 8A to 8E are cross-sectional views for explaining a method of forming an electronic device using a hardmask composition according to some example embodiments.

Figure 8A:
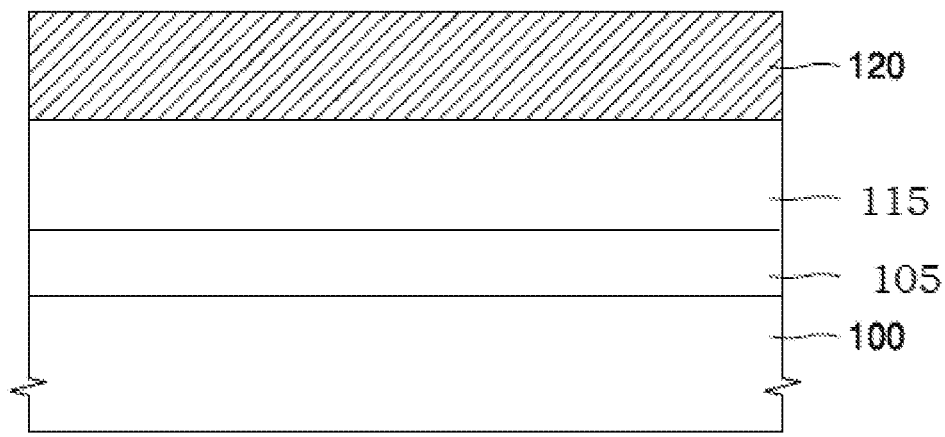

Referring to FIG. 8A, a gate dielectric 105 (e.g., silicon oxide) may be formed on a substrate 100. The substrate 100 may be formed of any one of the materials of the substrates 10 and 20 described above with reference to FIGS. 2A to 2E and 3A to 3D. A gate layer 115 (e.g., doped polysilicon) may be formed on the gate dielectric 105. A hardmask composition according to any of the above-described embodiments may be provided on gate layer in order to form a hardmask layer 120.

Figure 8B:
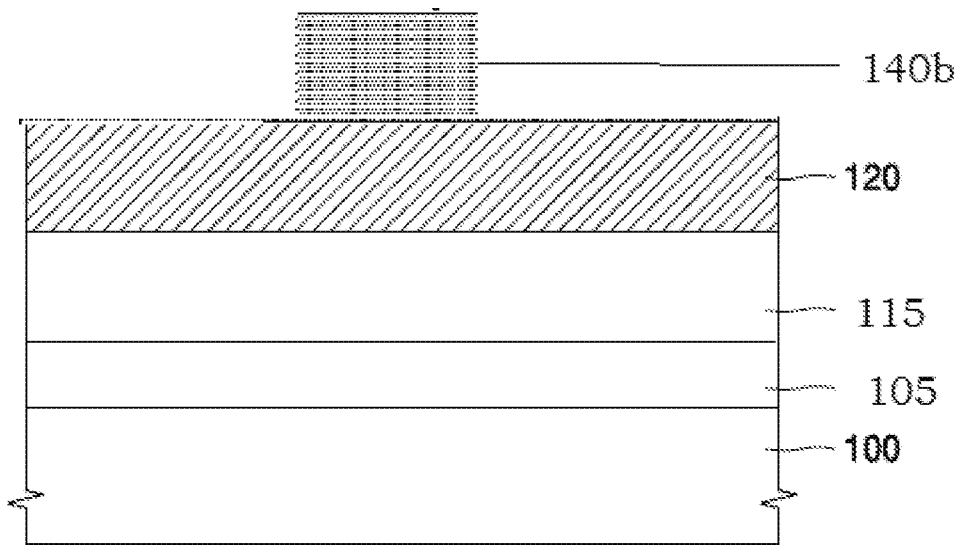

Referring to FIG. 8B, a photoresist pattern 140b may be formed on the hardmask layer 120.

Figure 8C:
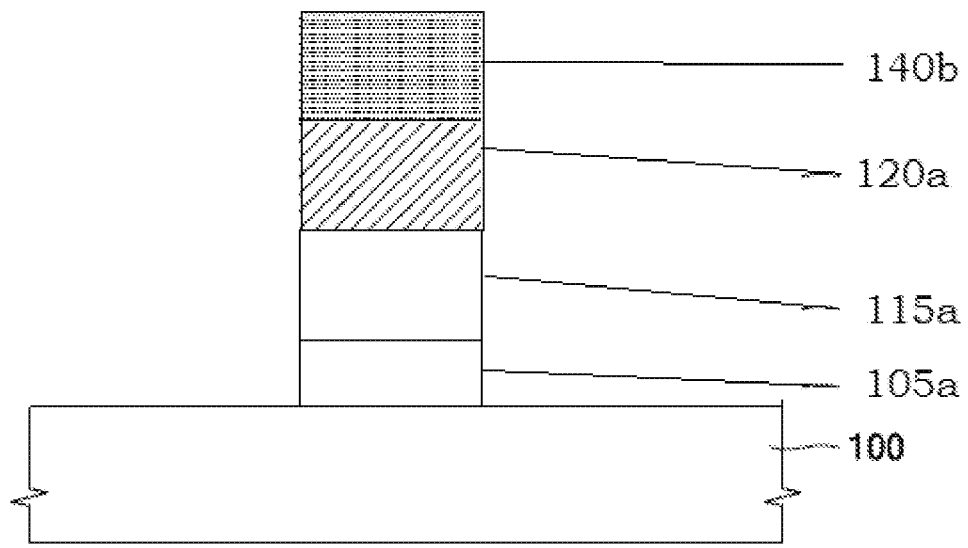

Referring to FIG. 8C, the gate layer 115 and gate dielectric 105 may be etched to form a gate electrode pattern 115a and a gate dielectric pattern 105a. Although not illustrated in FIGS. 8B and 8C, in some embodiments, an anti-reflection layer like the anti-reflection layer 30 in FIG. 3A may be formed on the hardmask layer 120 before forming the photoresist pattern 140b on the hardmask layer 120 and the etching process described in FIG. 8C may form an anti-reflection pattern 30a on the gate electrode pattern 115a in some embodiments.

Figure 8D:
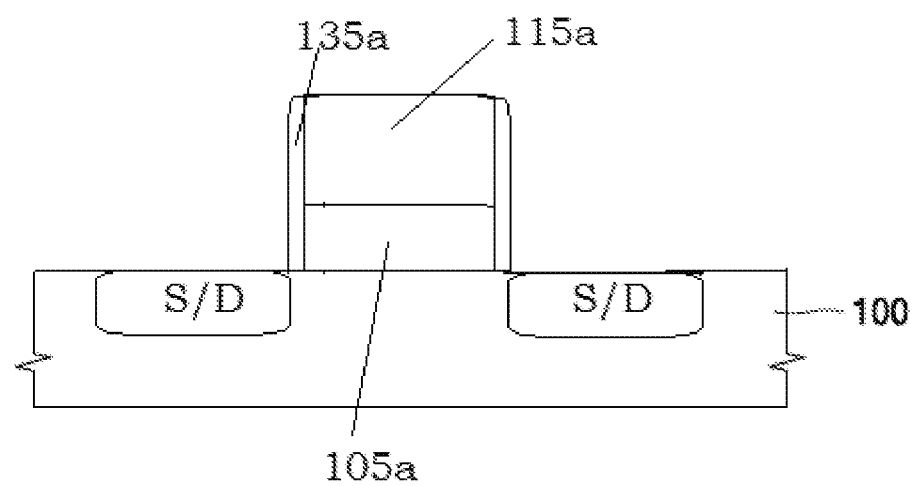

Referring to FIG. 8D, a spacer layer may be formed over the gate electrode pattern 115a and the gate dielectric pattern 105a. The spacer layer may be formed using a deposition process (e.g., CVD). The spacer layer may be etched to form spacers 125 (e.g., silicon nitride) on sidewalls of the gate electrode pattern 115a and the gate dielectric pattern 105a. After forming the spacers 125, ions may be implanted into the substrate 100 to form source/drain impurity regions S/D.

Referring to FIG. 8E, an interlayer insulating layer 160 (e.g., oxide) may be formed on the substrate 100 to cover the gate electrode pattern 115a, gate dielectric pattern 105a, and spacers 125. Then, electrical contacts 170a, 170b, and 170c may be formed in the interlayer insulating layer 160 to connect to the gate electrode 115a and the S/D regions. The electrical contacts may be formed of a conductive material (e.g., metal). Although not illustrated, a barrier layer may be formed between sidewalls of the interlayer insulating layer 160 and the electrical contacts 170a, 170b, and 170c. While FIGS. 8A to 8E illustrate an example of forming a transistor, inventive concepts are not limited thereto. Hardmask compositions according one or more embodiments may be used in a patterning process to form other types of electronic devices.

As described above, according to the one or more embodiments, graphene quantum dots may be easily prepared using a method according to any of the above-described embodiments with an increased yield and on a mass scale due to less limitations in choosing available precursors and catalysts. When using a hardmask composition according to any of the above-described embodiments using the graphene quantum dots prepared by using the method according to any of the embodiments, a hardmask may have improved stability, improved etching resistance and improved mechanical strength, relative to a hardmask using a common polymer, due to the use of the graphene quantum dots having good solubility characteristics in a semiconductor process solvent.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of preparing a graphene quantum dot, the method comprising:
reacting a graphene quantum dot composition including a polyaromatic hydrocarbon compound and an organic solvent at an atmospheric pressure and a temperature of about 250° C. or less, the polyaromatic hydrocarbon compound including at least four aromatic rings,
wherein an amount of the polyaromatic hydrocarbon compound including at least four aromatic rings in the graphene quantum dot composition is in a range of about 0.01 wt % to about 40 wt %.

2. The method of claim 1, wherein the polyaromatic hydrocarbon compound including at least four aromatic rings is at least one selected from 1,3,6-nitropyrene, 1,2-dinitropyrene, 1,6-dinitropyrene, 1,3,6-trichloropyrene, and 1,3,6,8-tetrachloropyrene.

3. The method of claim 1, wherein the graphene quantum dot composition further includes a catalyst.

4. The method of claim 3, wherein
the catalyst is a precious metal catalyst, a precious metal transition metal alloy catalyst, a semiconductor catalyst, an organic catalyst, or a combination thereof,
the precious metal catalyst includes at least one precious metal selected from Pt, Pd, Ir, Rh, Ru, and Re,
the precious metal transition metal alloy catalyst includes an alloy of at least one precious metal selected from among Pt, Pd, Ir, Rh, Ru, and Re, and at least one transition metal selected from among) Ti, V, Mn, Cr, Fe, Ni, Co, Cu, and Zn,
the semiconductor catalyst includes an oxide of at least one Si, Ge, or Sn, and
the organic catalyst comprises at least one amine compound selected from 4-(dimethylamino)pyridine (DMAP), diisopropylethylamine (DIEA), pyridine, triethylamine, 2,6-lutidine, collidine, 4-(dimethylamino) pyridine(DMAP), 1,5-diazabicyclo[4.3.0]non-5-ene (DBN), and 1,8-diazabicyclo[5.4.0]undec-7-ene (DBU).

5. The method of claim 1, wherein the organic solvent is at least one selected from among methyl-2-pyrrolidone, dimethylformamide, dimethylsulfoxide, dimethylacetamide, hexamethylphosphoramide, tetramethylene sulfone, and N-methylformamide; or a mixture thereof.

6. A hardmask composition comprising:
the graphene quantum dot prepared using the method of claim 1, the graphene quantum dot having a size of about 50 nm or less; and
a composition solvent.

7. A hardmask composition comprising:
a composition solvent; and
a graphene quantum dot, the graphene quantum dot prepared by a preparation method that includes reacting a graphene quantum dot composition including a polyaromatic hydrocarbon compound and an organic solvent at an atmospheric pressure and a temperature of about 250° C. or less, the polyaromatic hydrocarbon compound including at least four aromatic rings,
wherein
the graphene quantum dot has no peak at a chemical shift of about 9 ppm to about 10 ppm, as analyzed by nuclear magnetic resonance (NMR) spectroscopy, and
the graphene quantum dot has a size of about 50 nm or less.

8. The hardmask composition of claim 6, wherein a mixed atom ratio of carbon to nitrogen in the graphene quantum dot is about 8:1 to about 10:1.

9. The hardmask composition of claim 6, wherein the graphene quantum dot has at an end thereof at least one functional group selected from the group consisting of a hydroxy group, a carbonyl group, a carboxyl group, an epoxy group, an amine group, and an imide group.

10. The hardmask composition of claim 6, wherein the composition solvent is at least one selected from water, methanol, isopropanol, ethanol,N,N-dimethylformamide, N-methyl-2-pyrrolidone, dichloroethane, dichlorobenzene, dimethylsulfoxide, xylene, aniline, propylene glycol, propylene glycol diacetate, 3-methoxy1,2-propanediol, diethylene glycol, γ-butyrolactone, acetylacetone, cyclohexanone, monomethyl ether acetate, O-dichlorobenzenee, nitromethane, tetrahydrofuran, nitrobenzene, butyl nitrite, methyl cellosolve, ethyl cellosolve, diethylether, diethylene glycol methyl ether, diethylene glycol ethyl ether, dipropylene glycol methyl ether, toluene, hexane, methylethylketone, methyl isobutyl ketone, hydroxymethylcellulose, propylene glycol monomethylether acetate (PGMEA), propylene glycol monomethyl ether (PGME), ethyl lactate, and heptane.

11. The hardmask composition of claim 6, wherein an amount of the graphene quantum dot is about 0.1 parts to about 40 parts by weight based on 100 parts by weight of the hardmask composition.

12. The hardmask composition of claim 6, wherein the hardmask composition further includes at least one of:
at least one selected from the group consisting of a zero-dimensional (0D) carbon structure and a precursor thereof;
at least one first material selected from the group consisting of an aromatic ring-containing monomer and a polymer containing a repeating unit including an aromatic ring-containing monomer;
at least one second material selected from the group consisting of a hexagonal boron nitride derivative, a metal chalcogenide material, a hexagonal boron nitride derivative precursor, and a metal chalcogenide material precursor;
at least one third material selected from the group consisting of a silicon derivative and a metal oxide;
at least one fourth material selected from the group consisting of a 2-dimensional (2D) carbon nanostructure, a 0D carbon nanostructure, a 2D carbon nanostructure precursor, and a 0D carbon nanostructure precursor; or
a combination thereof.

13. A method of forming a pattern, comprising:
forming a target etching layer on a substrate;
forming a hardmask on the target etching layer, the hardmask including a product of coating a hardmask composition onto the target etching layer and thermally treating the hardmask composition,
the hardmask composition including a composition solvent and a graphene quantum dot,
the graphene quantum dot having a size of about 50 nm or less,
the graphene quantum dot being prepared by a preparation method that includes reacting a graphene quantum dot composition including a polyaromatic hydrocarbon compound and an organic solvent at an atmospheric pressure and a temperature of about 250° C. or less, the polyaromatic hydrocarbon compound including at least four aromatic rings;

forming a photoresist layer on the hardmask;

forming a hardmask pattern using the photoresist layer as an etch mask, the hardmask pattern including the product of coating and thermally treating the hardmask composition; and etching the target etching layer using the hardmask pattern as an etch mask.

14. A hardmask comprising:

a product of coating and thermally treating the hardmask composition of claim 6.

15. A hardmask comprising:

a product of coating and thermally treating the hardmask composition of claim 7.

16. The hardmask of claim 14, wherein in a X-ray photoelectron spectra (XPS) of the product of coating and thermally treating the hardmask composition, a binding energy at a maximum intensity of a peak corresponding to C1s of the product is about 284 eV to about 290 eV, which is greater than a peak intensity corresponding to C1s of graphene quantum dots obtained by hydrothermal reaction, and a binding energy of a peak corresponding to $sp^3$ C—N of the product is about 287 eV to about 289 eV.

17. The hardmask of claim 14, wherein in a X-ray photoelectron spectra (XPS) of the product of coating and thermally treating the hardmask composition, a binding energy at a maximum intensity of a peak corresponding to O1s of the product is about 530 eV to about 535 eV, which is about 1.1 times or greater than a peak intensity corresponding to O1s of graphene quantum dots obtained by hydrothermal reaction.

18. The hardmask of claim 14, wherein in a X-ray photoelectron spectra (XPS) of the product of coating and thermally treating the hardmask composition, a binding energy at a maximum intensity of a peak corresponding to N1s of the product is about 398 eV to about 402 eV, which is about 2 times or greater than a peak intensity corresponding to N1s of graphene quantum dots obtained by hydrothermal reaction.

19. The hardmask of claim 14, wherein the hardmask composition further includes at least one of:

at least one selected from the group consisting of a zero-dimensional (0D) carbon structure and a precursor thereof;

at least one first material selected from the group consisting of an aromatic ring-containing monomer and a polymer containing a repeating unit including an aromatic ring-containing monomer;

at least one second material selected from the group consisting of a hexagonal boron nitride derivative, a metal chalcogenide material, a hexagonal boron nitride derivative precursor, and a metal chalcogenide material precursor;

at least one third material selected from the group consisting of a silicon derivative and a metal oxide;

at least one fourth material selected from the group consisting of a 2-dimensional (2D) carbon nanostructure, a 0D carbon nanostructure, a 2D carbon nanostructure precursor, and a 0D carbon nanostructure precursor; or a combination thereof.

* * * * *